US011012027B2

(12) United States Patent
Zuckerman

(10) Patent No.: US 11,012,027 B2
(45) Date of Patent: May 18, 2021

(54) SYSTEMS AND METHODS FOR CONVERSION OF SOLAR ENERGY TO ELECTRIC POWER

(71) Applicant: Nex-Gen Solar Technologies, LLC, Fort Lauderdale, FL (US)

(72) Inventor: Mathew M. Zuckerman, Carbondale, CO (US)

(73) Assignee: Nex-Gen Solar Technologies, LLC, Ft. Lauderdale, FL (US)

( * ) Notice: Subject to any disclaimer, the term of this patent is extended or adjusted under 35 U.S.C. 154(b) by 0 days.

(21) Appl. No.: 16/186,474

(22) Filed: Nov. 9, 2018

(65) Prior Publication Data
US 2019/0222166 A1    Jul. 18, 2019

Related U.S. Application Data

(60) Provisional application No. 62/583,822, filed on Nov. 9, 2017, provisional application No. 62/622,003, filed on Jan. 25, 2018.

(51) Int. Cl.
*H01L 31/043* (2014.01)
*H01L 31/028* (2006.01)
(Continued)

(52) U.S. Cl.
CPC ............. *H02S 20/32* (2014.12); *F24S 23/70* (2018.05); *H01L 31/028* (2013.01);
(Continued)

(58) Field of Classification Search
CPC ............. H01L 31/043; H01L 31/0216; H01L 31/02168; H01L 31/028; H01L 31/054; H01L 31/0547; H02S 20/32; F24S 23/70
See application file for complete search history.

(56) References Cited

U.S. PATENT DOCUMENTS 4,409,422 A * 10/1983 Sater .................. H01L 31/0687
136/244
5,164,020 A    11/1992 Wagner et al.
(Continued)

OTHER PUBLICATIONS

United States Patent & Trademark Office, International Search Report and Written Opinion, PCT/ISA/220, Application No. PCT/US2018/060203, dated Jun. 26, 2019, U.S. Patent & Trademark Office, Alexandria, VA.

*Primary Examiner* — Mayla Gonzalez Ramos
(74) *Attorney, Agent, or Firm* — Thomas P. O'Connell; O'Connell Law Firm

(57) ABSTRACT

A system for converting solar energy to electric power and a glass for a layer of solar cells in the system. A solar panel installation comprises a solar panel with at least one solar cell formed with a stack of plural layers of photovoltaic wafer material. Each layer of wafer material has an edge direction from a recipient edge to a back edge, and the solar cell is retained within the solar panel installation with the photovoltaic wafer material disposed with the edge direction aligned with incident solar direction. Reflective material applied to facing surfaces of the photovoltaic wafer material facilitates internal reflection of photons. A glass layer has plural sheets of Graphene layered to form a Graphene Cube constructed to exhibit Multiple Excitation Generation (MEG). A method for assembling the glass fixes a top glass above a bottom glass with photovoltaic wafer material establishing a fixed distance therebetween.

17 Claims, 21 Drawing Sheets

(51) Int. Cl.
   *H01L 31/054*    (2014.01)
   *H01L 31/0216*   (2014.01)
   *H02S 20/32*     (2014.01)
   *H01L 31/0352*   (2006.01)
   *F24S 23/70*     (2018.01)

(52) U.S. Cl.
   CPC .............. *H01L 31/02168* (2013.01); *H01L 31/035218* (2013.01); *H01L 31/043* (2014.12); *H01L 31/0547* (2014.12)

(56) References Cited

U.S. PATENT DOCUMENTS

| | | |
|---|---|---|
| 2009/0217976 A1 | 9/2009 | Cart et al. |
| 2011/0100417 A1 | 5/2011 | Jang et al. |
| 2012/0152322 A1* | 6/2012 | Kribus ............... H01L 31/0687 136/249 |
| 2014/0096819 A1 | 4/2014 | Kirkengen et al. |
| 2014/0231718 A1* | 8/2014 | Lin ..................... H01B 1/02 252/503 |
| 2014/0299177 A1 | 10/2014 | Sha et al. |
| 2017/0098729 A1 | 4/2017 | Fisher et al. |
| 2018/0105426 A1* | 4/2018 | Sung .................. B01J 35/12 |

\* cited by examiner

PHOTONS
14 Watts = 14 joules / seconds
Energy Distribution is 1/3 each

| | UltraViolet | Visible | InfraRed |
|---|---|---|---|
| | < 410 nm | 410-680 nm | > 680 nm |
| joules/photon | $7.7 \times 10^{-18}$ | $3.85 \times 10^{-18}$ | $1.9 \times 10^{-18}$ |
| Average | | $5.29 \times 10^{-18}$ | |

Photons/second = (14 joules /seconds) / $5.29 \times 10^{-18}$
= $2.64 \times 10^{18}$ Photons/second

AVAILABLE ELECTRONS

| | UltraViolet | Visible | InfraRed |
|---|---|---|---|
| Joules/Photon | $7.7 \times 10^{18}$ | $3.85 \times 10^{18}$ | $1.9 \times 10^{18}$ |
| Electrons/Photon | 5 | 2.5 | 1 |
| Average | | 3 Electrons/Photon | |

CARBON
Each Six (6) Inch length side is $1.5 \times 10^{-19}$ nm
Parallel Carbon Distance is 0.246 nm $$\text{Carbons} = \frac{(1.5 \times 10^{-19} \text{ nm})^2 \times 6 \text{ Cs} \times 8 \text{ Layers}}{0.246 \text{ nm}}$$

Carbons = $4.4 \times 10^{18}$ = $44 \times 10^{19}$

Photons/Second/Carbon
$$\frac{2.64 \times 10^{18} \text{ Photons/second}}{4.4 \times 10^{18} \text{ Carbons}}$$
0.6 Photons/Second/Carbon Available Electrons/Second/Carbon
0.6 Photons x 3 Electrons/Photon
1.8 Electrons/Second

ELECTRONS
14 Watts – 4 Volts – 3.5 Amps
3.5 amps/second = 3.5 coulombs /second
1 electron = $1.602 \times 10^{-19}$ coulombs $$\text{Electrons/second} = \frac{3.5 \text{ coulombs /second}}{1.602 \times 10^{-19} \text{ coulombs}}$$

Electrons/second = $2.18 \times 10^{19}$

For a 6 inch by 6 inch cell to deliver the requisite 14 watts each Carbon atom has to produce electrons at a rate of three (3) per minute

FIG. 17

| Length, nm | Full Wave | Half Wave | Quarter Wave |
|---|---|---|---|
| Primary - Yellow | | | |
| Band Gap, eV | 3.2 | 1.6 | 0.8 |
| Wave Length, nm | 388 | 775 | 1550 |
| First Harmonic - Blue | | | |
| Band Gap, eV | 2.6 | 1.3 | 0.65 |
| Wave Length, nm | 477 | 954 | 1846 |
| Second Harmonic - Violet | | | |
| Band Gap, eV | 2.1 | 1.05 | 0.53 |
| Wave Length, nm | 590 | 1118 | 2273 |

8) The following is a sequence for manufacture.

ATTACHMENT A
Glass Specification
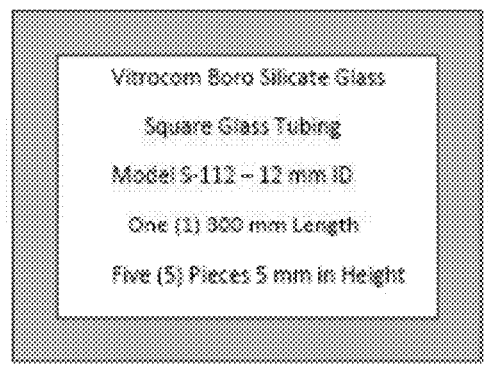
99.5% Transmission
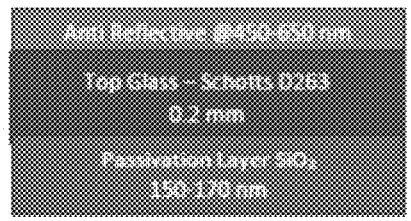
88% Reflection
450-650 nm
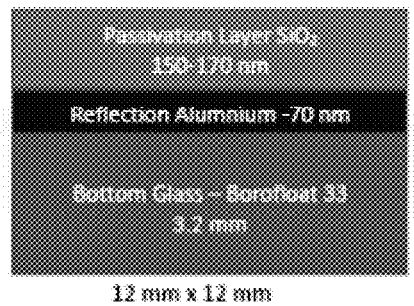
12 mm x 12 mm
FIG. 20

|        | GROUP |      |      |
|--------|-------|------|------|
| PERIOD | 13    | 14   | 15   |
| 1      | H 2.1 |      |      |
| 2      | B 2.04 | C 2.55 | N 3.04 |
| 3      | AL 1.61 | Si 1.9 | P 2.19 |

TABLE I

FIG. 27

| B 2.04 | C 2.55 | 0.51 |

| C 2.55 | N 3.04 | -0.49 |

| B 2.04 | Si 1.9 | -0.14 |

| Si 1.9 | N 3.04 | -1.14 |

TABLE II

FIG. 28

SYSTEMS AND METHODS FOR CONVERSION OF SOLAR ENERGY TO ELECTRIC POWER

RELATED APPLICATIONS

This application claims priority to U.S. Provisional Application No. 62/583,822, filed Nov. 9, 2017, and U.S. Provisional Application No. 62/622,003 filed Jan. 25, 2018, both of which being incorporated herein by reference.

FIELD OF INVENTION

The present invention relates generally to solar energy conversion. More particularly, disclosed herein are solar energy conversion systems and methods for producing such solar energy conversion systems, including solar energy panels and arrays of such panels, operative to capture improved percentages of incident solar energy. Embodiments of the solar energy conversion systems and methods comprise and exploit solar panels with portions that were dedicated to silicon in prior art constructions replaced with metal so that solar cells with greater than one junction can be economically employed to be operative with improved efficiency and to provide enhanced harvesting of energy from the solar spectrum. Solar panels as disclosed herein and systems and methods exploiting such solar panels seek to achieve solar energy conversion capacity exhibiting a reduced cost per watt. In carrying forth the concepts disclosed herein, but without limiting the scope of protection of the invention, manifestations of the solar panels seeking to provide improved harvesting and conversion of solar energy may exploit one or more of the following: photovoltaic material for solar cells with band gaps selected for capture of a large portion of high energy photons present in the Sun's solar spectrum, orienting the crystalline structure of the solar cell material in alignment with incident light to achieve optically parallel operation and direct illumination thereby permitting reduced thickness of costly materials and reducing efficiency-robbing heat accumulation, and providing a reflective cavity in each solar cell that reflects or "ping pongs" photons to increase their chances of absorption and being turned into electrical power.

BACKGROUND OF THE INVENTION

Photovoltaic cells, commonly referred to as solar cells, are founded on semiconductor material that directly converts light energy into electrical energy through the photovoltaic process. There, the photovoltaic cell can be seen to have an n-type semiconductor and a p-type semiconductor with a p-n junction therebetween forming a depletion region. When light illuminates the surface of the solar cell, a portion of the photons with energy greater than the bandgap of the semiconductor are absorbed by the materials. The absorption activates electron transitions from the valance to the conduction band, so that electron holes pairs are generated. If these carriers can diffuse into the depletion region before they recombine, they can be separated by the applied electric field at the p-n junction. The negative electrons diffuse into the n-type region and the positive holes diffuse into the p-type region. The electrons are collected by electrodes, resulting in a voltage difference between the electrodes. When a load is connected, electric current flows through the connected load.

Basic parameters used to describe the performance of a solar cell include the short-circuit current ($I_{sc}$), the open circuit voltage ($V_c$), and the fill factor (FF). The $I_{sc}$ is determined by the spectral response of the device, the junction depth, and the in-series internal resistance ($R_g$). The open circuit voltage ($V_c$) is the voltage appearing across the output terminals of the solar cell when there is no load present such that J=0. The FF is the ratio of maximum electrical power available from the solar cell at points $J_{op}$ and $V_{op}$. The FF is equal to the product of $J_{op}$ times the $V_{op}$ divided by the $J_{sp}$ times the $I_{oc}$.

At present, over eighty percent (80%) of solar cells in production are made from either single-crystal or multigrain silicon (Si). Crystalline silicon suffers from a fundamental disadvantage in that the band gap is indirect with an axis at ninety degrees (90°) to the axis of the illuminating light. This requires silicon cells to be cut from thick wafers and makes large quantities of this material necessary for adequate performance, making silicon unsuitable for thin film technology.

In FIG. 1, maximum efficiency is predicted for single junction cells constructed from six (6) different photovoltaic materials. Silicon, with a bandgap of 0.7 eV, absorbs photons in the visible and near infrared region with maximum possible solar energy conversion peaking at twenty-eight (28%) at the solar spectrum central response of 1.107 um. Because the solar spectrum that impinges on the solar cell is a range and not just the wavelength of the central response, the efficiency of silicon cells is twenty percent (20%). The present inventor has further recognized that other factors that reduce efficiency include optical reflection, junction resistance, recombination of photons, heat, and reduction of available incident light surface area due to shadowing of electrodes deposited on the surface of the cell.

A one-to-one correspondence exists between the band gap energy (eV) of a photovoltaic semiconductor and incident photonic energy at the wavelength of light equal to the solar spectrum central response. There is also a correspondence between the band gap on a linear scale and the energy for both the photons as a sender and the band gap of the photovoltaic material as the receiver. The equation for this correspondence is that the energy in eV is equal to the constant 1.24 divided by the wave length of the photon in micrometers (mu). Photovoltaic semiconductors have bandgap measured in eV that can be matched to the incident photonic energy at the wavelength of light equal to the solar spectrum central response.

The Solar Spectrum. The source of the Sun's energy is the nuclear fusion production of helium at a rate of $4 \times 10^3$ kilograms per second from hydrogen that is consumed at $3 \times 10^{11}$ kilograms/second. The energy emitted as electromagnetic radiation from this loss in mass can be calculated according to Einstein's equation $E=MC^2$ to be $4 \times 10^2$ Joules/second. This electromagnetic energy spans the wave lengths of ultraviolet (0.2 um) to infrared (3.0 um). The electromagnetic energy is attenuated as it travels through the earth's atmosphere. The energy density after the electromagnetic radiation travels 93 million miles and arrives outside of Earth's atmosphere is 1,343 watts per square meter of the Earth's surface (W/m²).

There are a plurality of sources of attenuation. For instance, at the infrared end of the solar spectrum, characterized by low energy photons, energy is absorbed by water vapor. At the ultraviolet end of the solar spectrum, characterized by high energy photons, energy is absorbed by ozone. Also, the level of energy of the entire range of the solar spectrum is attenuated by dust and aerosols. The total energy is attenuated, and the spectrum of this remaining solar energy is altered. The measure that takes the atmosphere's effect on the total energy is the air mass (AM), which is sometimes designated as AM O for an energy density outside of the Earth's atmosphere. When the Sun is directly overhead, the energy may be designated as AM 1 for an energy density of 925 W/m$^2$. When the Sun's angle to Earth is 48°, the energy may be designated as AM 1.5 for an energy density of 642 W/m$^2$. The incident solar energy density designated as AM 1.5 and AM 1.0 assume zero cloud cover. The solar spectrum can be closely approximated by assuming the Sun is a black body radiating at a temperature of 5,762° K (5,500° C.), which corresponds to a maximum wave length occurring at 0.503 um (wave length=2,897.8/T in degrees K).

Conversion of Solar Energy into Electrical Energy. The absorption of the energy from the solar spectrum at an energy density of AM 1.5 by a crystalline silicon solar cell with a band gap of 1.12 eV is shown in FIG. 2. The light energy incident on this solar cell that has a wavelength of 1.1 um or less has sufficient energy to have a chance of being absorbed to create current carriers whereas the light energy incident on this solar cell that has a wavelength of more than 1.1 lacks sufficient energy to have a chance of being absorbed to create current carriers. However, the light energy with a wave length of 1.1 um or less is not completely absorbed to create current carriers. The absorption of the same photons with wavelengths in the 1.0 to 1.1 um range (1.12 to 1.24 eV) is only fifty percent (50%) of the available photons, and the absorption for these high energy photons is further reduced so that, at a wavelength of 0.6 um (2.0 eV), only twenty-five percent (25%) of the available photons are absorbed.

Higher conversion efficiencies of solar energy to electric power can be achieved by using more than a single photovoltaic material to construct a multi-junction cell by connecting two to four materials together in illumination series. Due to their high cost, multi junction solar cells have traditionally been reserved for applications in space. However, the cost of multi-junction cells used in conjunction with solar concentrators, which concentrate the solar energy density by as much as 1,000 times (1,000 Suns), reduces the overall cost of panels by covering 1/1,000$^{th}$ of the panel surface thereby allowing the use of multi-junction solar cells in terrestrial applications.

Gallium indium phosphide (GaInP) has an Electron Gap 3 (Eg3) equal to 1.8 eV at the solar spectrum central response at 0.691 um. The light that appears after travelling through the greatest travel distance through the prism is captured by the bottom layer of the multi-junction cell that contains Ge. The Ge has Eg1 equal to 0.7 eV at the solar spectrum central response at 1.771 um. The in-between light path in the near infrared is captured by the intermediate layer of the multi-junction cell that contains the photovoltaic material GaAs. The GaAs has Eg2 equal to 1.4 eV at the solar spectrum central response at 0.88 um. When illuminated at AM 1.5, the ideal efficiency for this three (3) material multi-junction cell is calculated to be 35% at one Sun illumination and 41% at the concentrated illumination of 500 Suns.

NREL forecasts the future availability of photovoltaic materials for multi junction cells. The GaAs, 1.4 eV in the three (3) layer material multi-junction cell is projected to be replaced by a photovoltaic material with 1.2 eV band gap to increase the calculated ideal efficiencies to be 38% at one Sun illumination and 41% at the concentrated illumination of 500 Suns. Also, the NREL has forecast that a fourth (4$^{th}$) photovoltaic will be available in the future for multi junction solar cells with a band gap of 1.0 eV to increase the calculated ideal efficiencies to be 41% at one Sun and 52% at 500 Suns.

For absorption at solar intensity of 1.5 AM, the GaAs layer, which is direct, requires only 2 um thickness, whereas a Si layer, which is indirect, requires a 10-um thickness to provide equal absorption of AM 1.5 solar energy. However, due to the mass production of Si for electronics applications, the cost of the Si material, which is roughly five times greater, is less than the cost of the low-volume-produced GsAs, for this material's use has been traditionally confined to low volume photovoltaic applications. The layers of multi-junction cells are in optical series as well as in electrical series. The indirect photovoltaic material ZeBeSe at 97.2% B is lattice-matched to GaAs and at 45% B is lattice-matched to Silicon with a lattice constant of 5.138 Å.

Shown in FIG. 3 is the positioning of the widely used elemental, binary, and tertiary photovoltaic materials in terms of their band gaps that correspond to wavelengths of light equal to the solar spectrum central response, crystalline structure type, and lattice constants. One will notice that the lattice constant of the three materials used in the production of the multi-junction solar cells shown in FIG. 7 share the same lattice constant. The lattice constant of Ge and GaAs are the same, and the percentage by weight of Indium (In) in the tertiary compound GaInP is selected in the same manner as the Be percentage in ZnBeSe. With that, matching lattice constants are obtained.

What is not shown in FIG. 3 is that the Ge, Si, and GaP have indirect band gaps. As such, when they are used as the materials in photovoltaic cells, a photon must travel five to as many as twenty times deeper into the material to a site of absorption than the required travel distance of a material with the same band gap but with a direct band gap absorbing material. Thus, indirect band gap material must be thicker, requiring more of the costly photovoltaic material, than direct band gap material.

There is a fundamental and long-recognized need in the photovoltaic industry for lower-cost photovoltaic panels, typically measured as watts of electrical power produced per dollar of capital investment. The present inventor has further recognized a need for the exploration and development of the element materials involved in the construction and operation of solar cells to produce solar cells of advanced efficiency.

Innumerable skilled inventors have provided useful advances in this field. However, the continuing need for improved solar energy conversion efficiency remains, and it continues to present a significant obstacle to the widespread adoption and commercial success of solar electric power generation.

SUMMARY OF THE INVENTION

With a recognition of the foregoing, including the long-standing needs in the photovoltaic industry, the present inventor set forth with the fundamental object of providing photovoltaic solar cells and panels that contain a plurality of solar cells that exhibit greater solar energy conversion efficiencies.

A related object of the invention is to increase solar energy conversion efficiencies in solar cells to produce increased watts of electrical power per dollar of capital investment.

Embodiments of the solar energy conversion systems and methods disclosed herein have the object of saving required material thickness for the direct absorption of the solar energy, the activating electron transition, to occur and to reduce the negative impact of efficiency losses associated with heating of the solar cell.

It is a further object of manifestations of the invention to re-purpose low cost/abundant Silicon (Si) and Germanium (Ge) wafers, mass produced for use as electronic substrate, as source materials for multi junction solar cells as a substitute for high-cost, limited availability photovoltaic materials or photovoltaic-specific wafers, such as those produced by expensive epitaxial layering.

It is a still further object of embodiments of the invention to reduce incident solar energy losses that are associated with the reduction in front surface area by the obstruction of front surface ohmic contacts.

It is another and further object of embodiments of the solar energy conversion systems and methods to provide solar cells that are characterized by high voltage and low current for improving compatibility to power-processing loads and a tolerance to series resistance values as compared to conventional solar cells.

These and further objects, advantages, and details of the present invention will become obvious not only to one who reviews the present specification and drawings but also to those who have an opportunity to experience an embodiment of the solar energy conversion systems and methods disclosed herein in operation. However, it will be appreciated that, although the accomplishment of each of the foregoing objects in a single embodiment of the invention may be possible and indeed preferred, not all embodiments will seek or need to accomplish each and every potential advantage and function. Nonetheless, all such embodiments should be considered within the scope of the present invention.

To carry forth one or more objects of the invention, systems and methods for converting solar energy as disclosed herein use as source photovoltaic materials repurposed, low cost, and abundant, Silicon (Si) and Germanium (Ge) wafer materials that are mass-produced for use as electronic substrates as the source materials for multi-junction solar cells and as a substitute for high cost, limited availability photovoltaic materials or photovoltaic-specific wafers that are produced by expensive epitaxial layering.

In manifestations of the invention, wafers are stacked and cut in such a fashion that the crystalline structure of the solar cell material is oriented to align with incident light to achieve optically parallel operation and direct illumination thereby reducing the thickness of costly materials and reducing efficiency-robbing heat. Advances are also proposed seeking to identify and optimize the elemental materials advantageous to producing high-efficiency solar cells.

In carrying forth one or more objects of the invention, one embodiment of the invention can be characterized as a system for the conversion of solar energy to electric power with solar light incident on the system from an incident solar direction. The system is founded on a solar panel installation that has at least one solar panel. The solar panel has at least one solar cell, and the solar cell is formed with a layered stack of plural layers of photovoltaic wafer material. Each layer of photovoltaic wafer material has a first face surface, a second face surface opposite the first face surface, a recipient edge, a back edge opposite the recipient edge, and an edge direction from the recipient edge to the back edge. In the system, the solar cell is retained within the solar panel installation with the photovoltaic wafer material disposed with the edge direction of the photovoltaic wafer material in an orientation aligned with the incident solar direction.

In practices of the invention, reflective material can be applied to at least one of the first face surfaces and to at least one of the second face surfaces of one or more of the layers of photovoltaic wafer material of the solar cell. With that, an internal reflection of photons of solar light incident on the solar panel is facilitated within the photovoltaic wafer material. It is taught for the reflective material to comprise, for instance, a reflective metal chosen from the group consisting of gold and an alloy of gold. It is further contemplated that an anti-glare layer can be applied to at least one surface of the solar cell. Embodiments of the system can employ Si and Ge cells as photovoltaic wafer material. comprises Si and Ge cells.

The system can further include ohmic electrical contacts in electrical communication with the layered stack of plural layers of photovoltaic wafer material. In particular constructions, the recipient edges of the layers of photovoltaic wafer material are devoid of the ohmic contacts thereby to promote full reception of incident light.

Each solar cell can further comprise a glass layer. The glass layer could have plural sublayers. At least one of the sublayers can include at least one Graphene sheet, and the Graphene sheet can incorporate doped Graphene. Even more particularly, it is contemplated that the doped Graphene of the Graphene sheet can exhibit a zero eV at 30 degrees chirality to a positive eV at angles above 30 degrees. Where doped Graphene is incorporated, it could for instance be formed by a process of immersion in Nitric Acid ($HNO_3$) for a predetermined time. Still further, according to the invention, the glass layer can further comprise hexagonal Boron Nitrogen (hBN) synthesized with Boron-rich conducting electrodes arched in pure Nitrogen gas.

It is further shown and described herein for there to be plural sheets of Graphene layered to form a Graphene Cube. The Graphene Cube so constructed can have resonating antennas operative to resonate to a range of frequencies of photons of light incident on the solar cell to be converted to electrons exhibiting Multiple Excitation Generation (MEG). In particular manifestations, there are plural Graphene Cubes, and each Graphene Cube has plural sheets of Graphene layered to form the Graphene Cube. Each of the sheets of Graphene can be separated by one or more hBN layers. Still further, it is contemplated that each Graphene Cube can have a top Graphene layer that is an n-type and a bottom layer that is a p-type doped with the one or more hBN layers being electrically connected.

In particular embodiments of the invention, there are plural sheets of Graphene layered to form Graphene wafer stacks with four (4) layers of Graphene oxide nanosheets (4-GON). It is further taught to have plural sheets of Graphene layered to form Graphene wafer stacks with eight (8) layers of Graphene oxide nanosheets (8-GON). There can be superconductive paths in the one or more hBN layers at 60 degrees chirality.

Also taught herein is a method for assembling glass for a layer of a solar cell with Graphene wafer stacks. The method can include inserting a bottom glass into a tube, such as a Square Glass Tube (SGT), and fixing the bottom glass in place. Type B hBN can be thermally transferred to the bottom glass, positioned in a chemically-etched passivation layer to electrically connect to form an anode connection to form a Trilogy Solar Cell. Further, a top glass can be positioned above the tube that contains the bottom glass with a layered stack of plural layers of photovoltaic wafer material attached to the top glass. The top glass can then be fixed in position with a distance between the top glass and the bottom glass is fixed at approximately 2.7 nm.

One will appreciate that the foregoing discussion broadly outlines the more important goals and features of the invention to enable a better understanding of the detailed description that follows and to instill a better appreciation of the inventor's contribution to the art. Before any particular embodiment or aspect thereof is explained in detail, it must be made clear that the following details of construction and illustrations of inventive concepts are mere examples of the many possible manifestations of the invention.

BRIEF DESCRIPTION OF THE DRAWINGS

The invention will be described and explained with additional specificity and detail with reference to the accompanying drawings in which:

FIG. 17 provides details and calculations relating to the "Cube" disclosed herein;

FIG. 20 comprises schematic views of glass as disclosed herein with glass specifications;

FIG. 27 comprises a table, identified as Table I, of the Pauling's Electronegativity Scale values for the elements referenced therein; and FIG. 28 comprises a table, identified as Table II, of the differences in electronegativity for the base elemental materials referenced therein.

DETAILED DESCRIPTION OF PREFERRED EMBODIMENTS

The systems and methods for the conversion of solar energy to electric power disclosed herein are subject to a wide variety of embodiments. However, to ensure that one skilled in the art will be able to understand and, in appropriate cases, practice the present invention, certain preferred embodiments of the broader invention revealed herein are described below and shown in the accompanying drawing figures.

The disclosed solar panels, arrays of such solar panels, and methods for manufacturing solar panels seek to achieve improved efficiency in converting solar energy to electric energy thereby to realize enhanced capacity per square meter of solar panel surface at a reduced capital cost per watt. The solar panels, arrays of solar panels, and methods for manufacturing solar panels may exploit one or more advances described herein. As shown in the attached drawings and described further below, solar panels as disclosed herein can demonstrate improved efficiency through the selection of materials for solar cells with band gaps enabling the capture of a large portion of the high energy photons present in the Sun's solar spectrum. Further, the crystalline structure of the solar cell material can be oriented for alignment with incident light to achieve optically parallel operation and direct illumination with the goal of reducing the thickness of costly materials and reducing efficiency-robbing heat. Still further, embodiments are contemplated wherein a reflective cavity is provided in each solar cell that reflects or "ping pongs" photons to increase their chances of absorption and being turned into electrical power.

Figure 1:
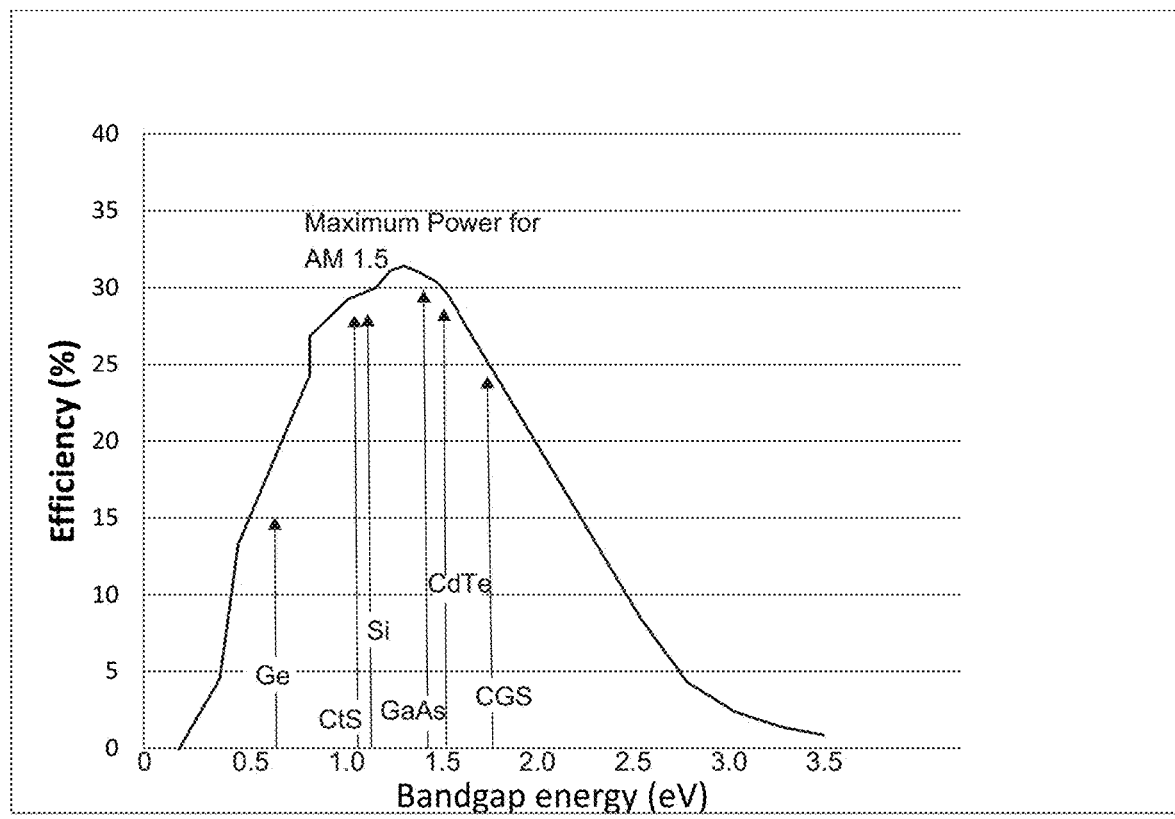
FIG. 1 is a graph of efficiency as a function of band gap energy for particular photovoltaic materials.
Figure 2:
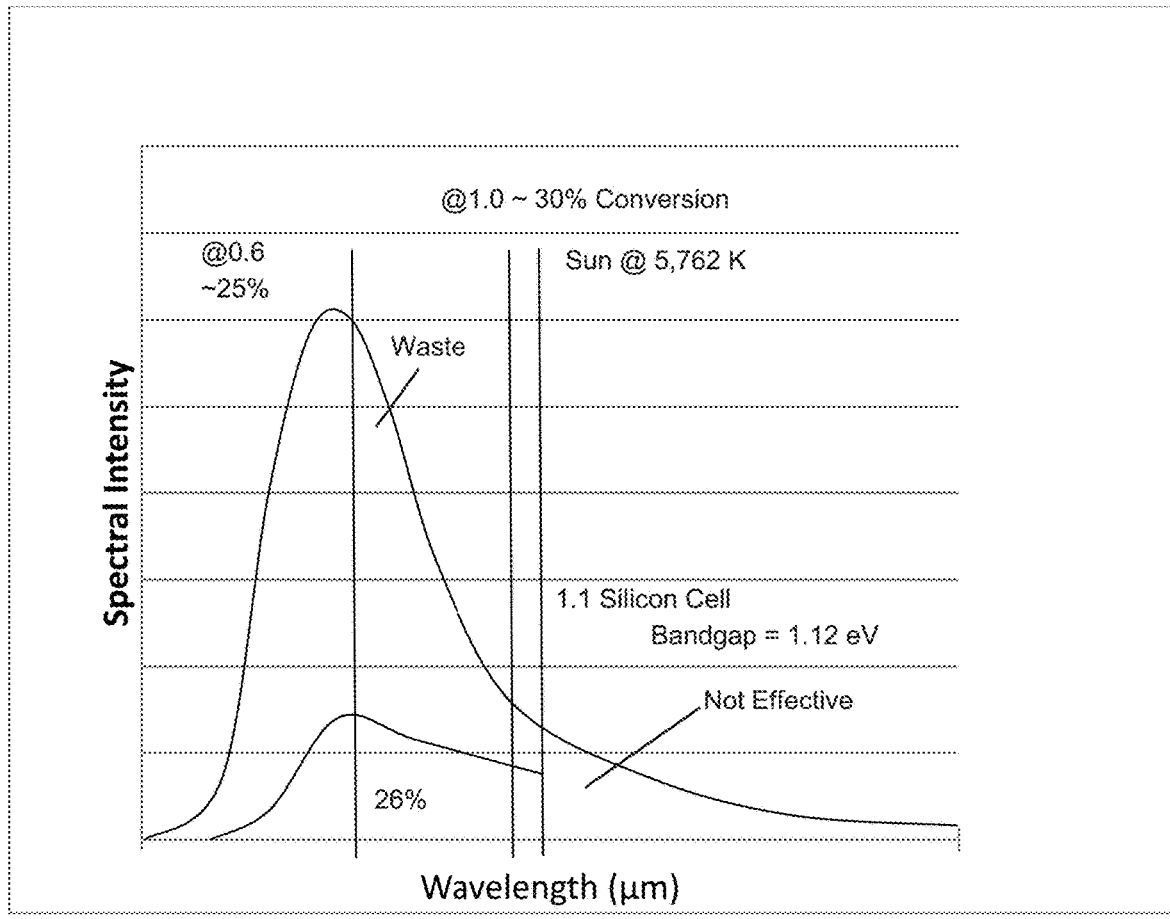
FIG. 2 is a chart of spectral intensity as a function of wavelength.
Figure 3:
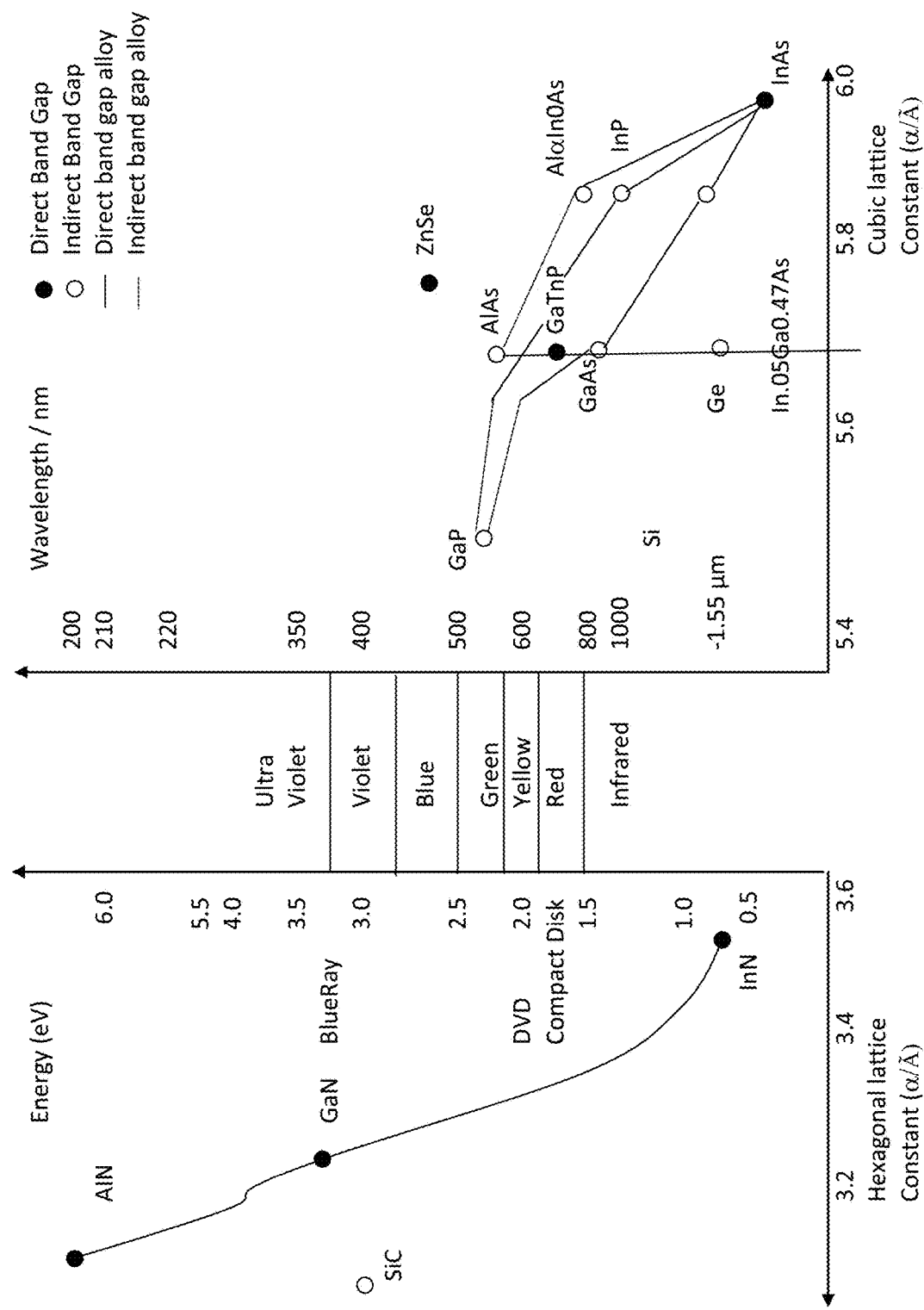
FIG. 3 depicts charts of elemental, binary, and tertiary solar cell source materials in terms of bandgap, corresponding photonic wavelength, crystalline structure, and lattice constants.
Figure 4:
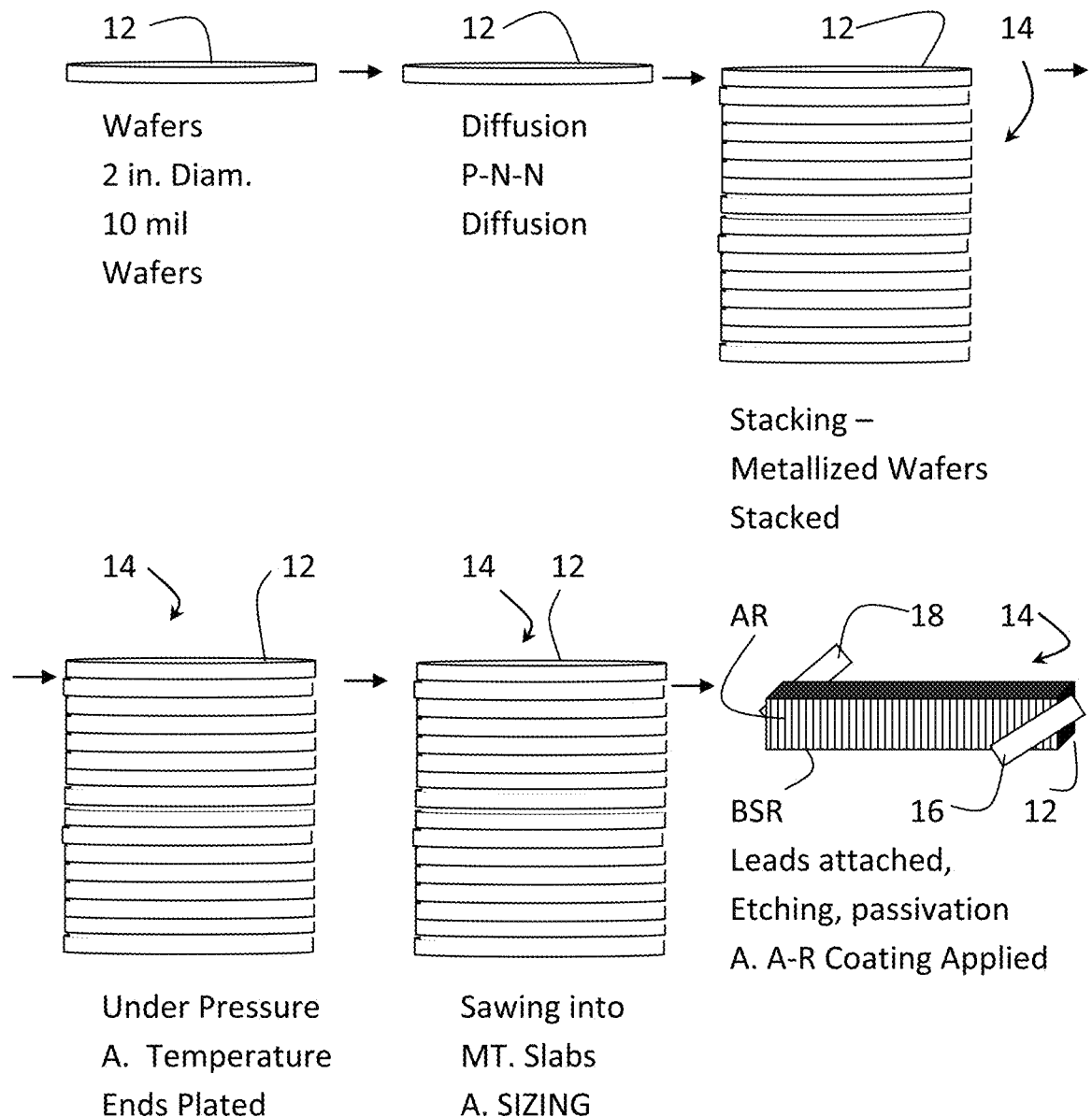
FIG. 4 is a schematic depiction of the fabrication steps in the manufacture of direct solar cells from wafers.

A schematic of the fabrication steps to manufacture direct solar cells from wafers 12 is depicted in FIG. 4. Processed are high resistance n-type wafers 12 in a sequence of steps that comprises diffusion to form planar p+n and n n+junctions on opposite surfaces of the wafers 12. The wafers 12 are then metalized. Following metallization, wafers 12 are stacked with first and second face surfaces of adjacent wafers in facing contact and alloyed together to form a stack 14. Thick slicing is carried out, such as by first cutting with a multiblade saw and then trimming to size. Saw damage to the stack 14 of wafers 12 is removed, such as by etching. The stack 14 is then trimmed to size. Passivating to reduce the reactivity of the surfaces of the stack 14 of wafers 12 is achieved, such as by the application of a dielectric layer. An anti-glare layer is applied to the front surface AR, and a reflective metal coating is applied to the back surface BSR. Electrical leads 16 and 18 are attached to the stack 14 so formed.

It will be understood that the characteristics of the wafers 12 and of the stack 14 of wafers 12 can vary within the scope of the invention. By way of a non-limiting example, the stack 14 in a preferred embodiment has thirty (30) Si wafers of 10 mils (250 microns) thickness; sixteen (16) Ge wafers of 10 mils (250 microns) thickness; and two (2) conductive wafers of 10 mils (250 micron) thickness. The resulting stack 14 of thirty-eight (38) wafers 12 has a height of one and two-tenths (1.2) centimeters.

Figure 5:
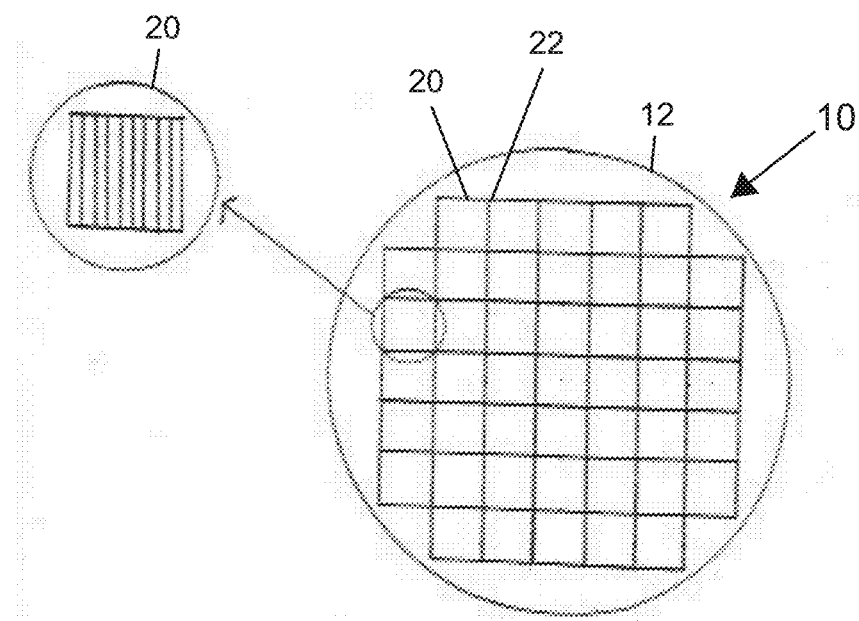
FIG. 5 is a top plan view of a sawing pattern for a stack of wafers with an amplified view of a solar cell.

A saw pattern is applied to the top wafer 12 as is shown in FIG. 5. Various diameter wafers 12 can be used. The semiconductor fabrication industry has moved to larger diameter wafers to reduce edge cut losses resulting from the cutting of rectangular shaped integrated circuits from circular wafers. This drive to larger diameter wafers has made the former diameter wafers including the three (3) inch wafer an extremely economical size for use in the present invention. For example, cutting a three (3) inch wafer along one axis yields forty-five (45) units with dimensions of one-centimeter square. Each unit is sawed into twenty (20) cells 20 by cutting at a spacing 22 to yield cells 20 of five hundredths (0.05) millimeters thickness. The total yield for one wafer stack 14 under such practices is nine hundred (900) multi-junction solar cells 20.

Figure 6:
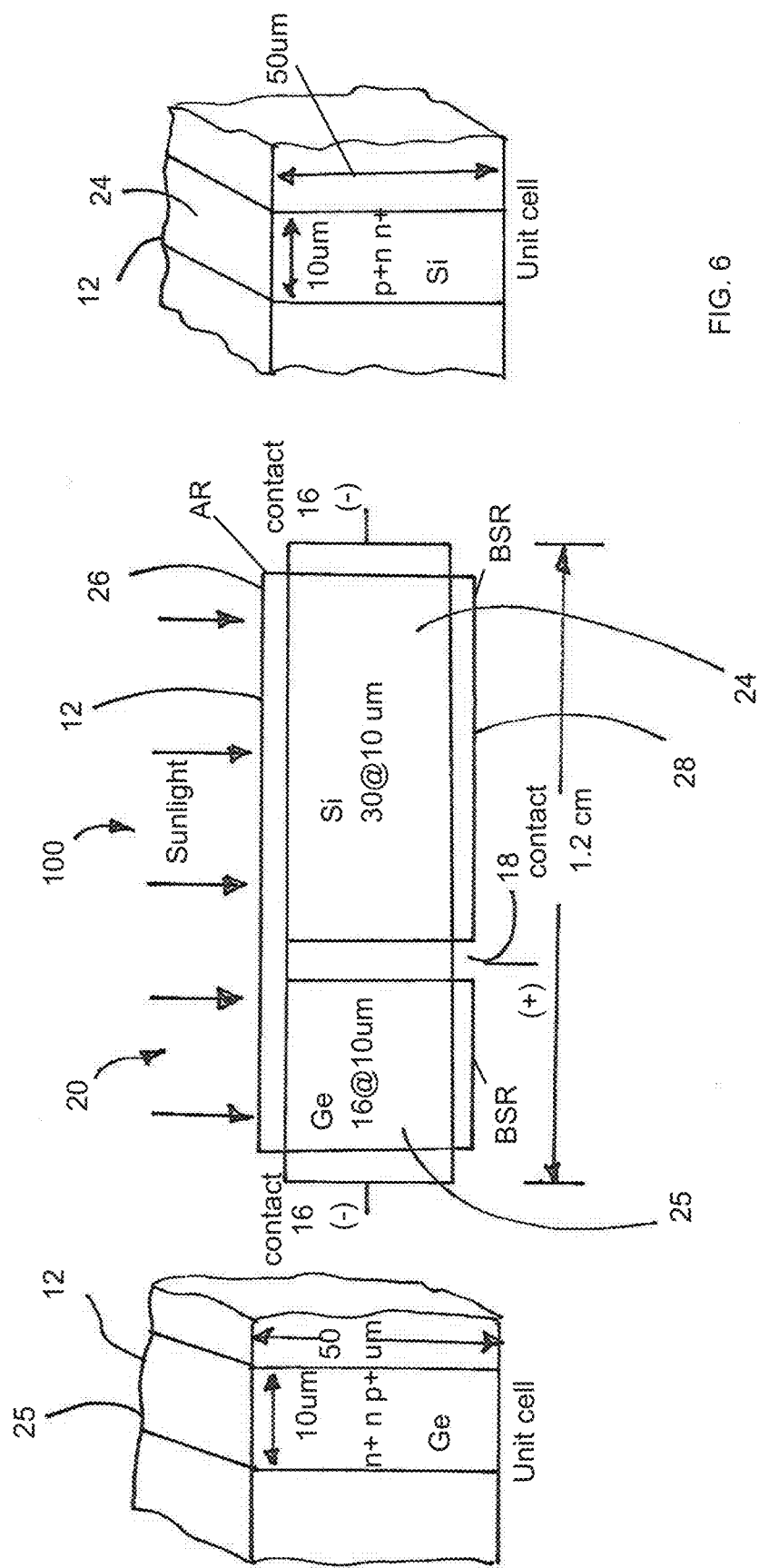
FIG. 6 comprises elevational, sectioned front and perspective views of a single solar cell cut from a wafer stack.

Looking to FIG. 6, a cross section of a solar cell 20, such as a cell 20 cut from a thirty-eight (38) wafer stack 14, is depicted within a solar panel installation to form a system for the conversion of solar energy to electric power. The photovoltaic materials of the cell 20 are rotated by ninety degrees (90°) in relation to incident light 100. Rotating the photovoltaic materials by this ninety degrees (90°) allows illumination to be received at the edge of the cell 20 so that the Si and Ge cells 24 and 25 can function as the thin, materials-saving, direct processors of solar illumination 100 rather than the material-heavy, indirect processor of solar illumination of conventional Si cells. By orientation of the crystalline structure of the materials of the solar cell 20 with the edge of the cell 20 disposed to receive incident light 100 and in alignment with incident light 100, the cell 20 achieves optically parallel operation and direct illumination of each cell 20 through the edge of the cell 20 so that less thickness of material is required and efficiency losses due to heat are lessened.

A system for the conversion of solar energy to electric power is thus established, potentially with multiple solar panels each with multiple solar cells 20, to form a solar panel installation. Solar light 100 is incident on the system from an incident solar direction. The solar cell 20 is formed with a layered stack 14 of plural layers of photovoltaic wafer material 12. Each layer of photovoltaic wafer material 12 can be considered to have a first face surface, a second face surface opposite the first face surface, a recipient surface or recipient edge AR, a back surface or back edge BSR opposite the recipient edge AR, and an edge direction from the recipient edge AR to the back edge BSR. The solar cell 20 is retained within the solar panel installation with the photovoltaic wafer material 12 disposed with the edge direction of the photovoltaic wafer material 12 in an orientation aligned with the incident solar direction 100.

As FIG. 6 further shows, an anti-glare layer 26 is applied to the recipient surface AR. Further, reflective coating 28, such as of metal, is applied to the back surface BSR and the two (2) sides (SSR) to form a reflective cavity in each solar cell 20 that reflects or "ping pongs" photons to increase their chances of absorption and being turned into electrical power. The physical dimension of each solar cell 20 in one example is one and two-tenths (1.2) centimeters in width by one (1) centimeter in length and five hundredths (0.05) millimeters in thickness.

The cells 20 of solar panels according to the invention can thus act as edge-illuminated cells 20 with edges of the crystalline structure of the materials of the solar cell 20 retained to be aligned with incident light 100. Such an orientation achieves direct illumination of the photovoltaic material of the cell 20 thereby to increase the efficiency of the capture of solar energy by the solar cell 20 and the conversion of that energy into electric power.

In relation to the foregoing, it is noted that NASA's Lewis Research Center in Cleveland, Ohio, performed testing on an edge-illuminated solar cell. In the table below, NASA's results are scaled, based on the comparative characteristic, to estimate the operational parameters for an embodiment of the present invention utilizing the dual materials of Si and Ge made from a stack of thirty-eight (38) wafers.

|  | NASA | Present Invention |
| --- | --- | --- |
| Junctions, Number | 23 | 30 |
| Area, cm | 0.49 | 1.2 |
| Suns, Number | 207 | 85.5 |
| Per Junction Voltage | 0.4 | 0.4 |
| E, volts | 9.2 | 12 |
| Efficiency, % | 17.4 | 35 |
| Current, I, ma | 151 | 550 |

It will be underscored that the foregoing and any other estimates and calculations set forth herein are predicted, anticipated, or desired results only and should not be interpreted as representations of actual performance unless and until verification in practice is achieved and made of record.

Efficiency. The overall efficiency of solar cells 20 for embodiments of the present invention is dependent on the sum of the efficiency of each of the operations. Therefore, the increase in overall efficiency that is projected for embodiments of solar cells 20 and solar panels 10 incorporating such cells 20 will be dependent on the sum of the increases in efficiencies of plural operations, which may include solar tracking in comparison to stationary panels; dual junction compared to single junction; direct versus indirect photovoltaic material; and multiple pass reflective cavities in comparison to single passes of light. Overall, preferred embodiments of the present invention incorporating the cumulation of the developments disclosed herein are projected to have an efficiency of double that of the conventional silicon technology or approximately forty percent (40%) compared to the twenty percent (20%) of conventional panels.

Electric Circuit. In embodiments of the solar panel 10 disclosed herein, the voltage per junction for Si and Ge may preferably be 0.4 v and 0.677 v, respectively. Where a wafer stack 14 of cells 20 has thirty (30) Si cells 24, they are calculated to produce a total seven and one-half (7.5) volts, and the sixteen (16) Ge cells 25 are calculated to produce a total of seven and on-half (7.5) volts. As in FIG. 6, the plurality of Si cells 25 and the plurality of Ge cells 24 are connected in series with a common positive terminal 18 located between the Si and the Ge cells 25 and 24 to produce 15 volts. The load connected to the common positive terminal 18 for the two materials and the negative terminals 16 at the ends of the Si and Ge cell stacks 14 receives 250 ma from the cells 24 and 25 constructed from each material for a total at 15 volts or 3.8 watts of electric power.

Graphene Quantum Dots (GQDs). Graphene, a special form of Carbon, can be produced by pulverizing and acid-etching coal. Multi-junction solar cells 20 can be manufactured exploiting quantum, very small, dots of Graphene sequenced to have band gaps that are closely matched to the energy of the photons at the wavelength of light equal to the central response of the solar spectrum to capture the solar spectrum and to achieve an improved efficiency, such as is predicted to be greater than sixty percent (60%). The ability to produce GQDs of different band gaps comes from the use of different grades of coal as source material coupled with different synthesis temperatures and is further based on the operating pH.

Comparison of the Present Invention's Panel to Rectangular Solar Panels of the Prior Art. Manufacturing plants for the present invention's panels 10 can be designed to incorporate the advantages of prior art production facilities while providing concomitant advances thereover. With limited automation, for instance, it is predicted that 75 semi-skilled production workers may be employed for each of the three shifts per day, seven days a week. The panels 10 disclosed herein, on a power generation basis, cost significantly less than the cost of manufacture of panels of the prior art with the disclosed panel 10 replacing expensive polycrystalline silicon, which is taught to occupy 95% of the panel's real estate. It is also contemplated that inexpensive parabolic mirror subassemblies 30 can be employed to occupy, for example, 99% of the area of the panel 10 as according to predicted performance data.

Graphene quantum dots (GQDs). Coal is a fossil fuel that is, essentially, the altered remains of prehistoric vegetation. However, there are different coal types. Coal originally began to form during the Carboniferous period, which took place between 360 and 290 million years ago. Put simply, plant matter accumulated in swamps and peat bogs, and after being buried and exposed to high heat and pressure—largely due to the shifting of tectonic plates—it was transformed into coal.

The quality of coal is largely determined by the type of vegetation the coal originated from the coal's, depth of burial, the temperatures and pressures at that depth, and how long it took the coal to form. These factors contribute to the degree of transformation of the original plant material to carbon, and it is carbon content that determines a coal's rank. Essentially, higher carbon content is associated with coal that has spent a longer time forming, while lower carbon content is a characteristic of younger coal.

The two main coal types of coal of interest in the present invention, arranged from lowest to highest carbon content, are Bituminous coal and Anthracite coal. Bituminous coal is harder and blacker than lignite and sub-bituminous coal, and can be divided into two types: thermal and metallurgical. Together, they make up 52 percent of the world's coal reserves. Thermal coal is mostly used for power generation, cement manufacturing and other industrial purposes, while metallurgical coal is used primarily for manufacturing iron and steel. Anthracite coal is the most mature coal and thus has the highest carbon content of any type of coal. It is frequently used for home heating and, accounting for about 1 percent of the world's total coal reserves, represents a very small portion of the overall market. Anthracite coal can be used as a smokeless fuel in domestic and industrial contexts.

In addition, Coke is a source material of interest in embodiments of the present invention. Coke is prepared by removing the volatile materials from coal by heating in a process called coking in which carbonization occurs.

Coal is a low-cost energy resource. Even though the structure of coal is complex, the simplified composition contains angstrom or nanometer-sized crystalline carbon domains with defects that are linked by aliphatic amorphous carbon. Coal is still mainly used as an energy source, in contrast to crystalline carbon allotropes, such as fullerenes, graphene, graphite and diamond, that have found applications in electronics, physics, chemistry and biology.

Graphene quantum dots (GQDs) have been synthesized or fabricated from various carbon-based materials. Physical approaches such as lithography, to etch the size of graphene to about 20 nm, are expensive and are impractical for production in bulk quantities for mass production versus laboratory scale production applications.

Coal's structural characteristics create a perception that coal is only useful for producing energy by combustion. The crystalline carbon within the coal structure is easier to oxidize and displace through an inexpensive wet-chemical method that synthesize wavelength tunable Graphene Quantum Dots (GQDs) from bituminous coal, anthracite coal, and coke resulting in nanometer-sized GQDs with amorphous Carbon added on the edges. The GQDs isolated by the wet-chemical method yield up to four hundred (400) pounds of GQDs per ton of coal or coke.

In the following, the wave length of photoluminescence of a photovoltaic GQD is used to express what has been previously referred to as the photon's wave length of light equal to the solar spectrum central response of the photovoltaic material.

Figure 7:
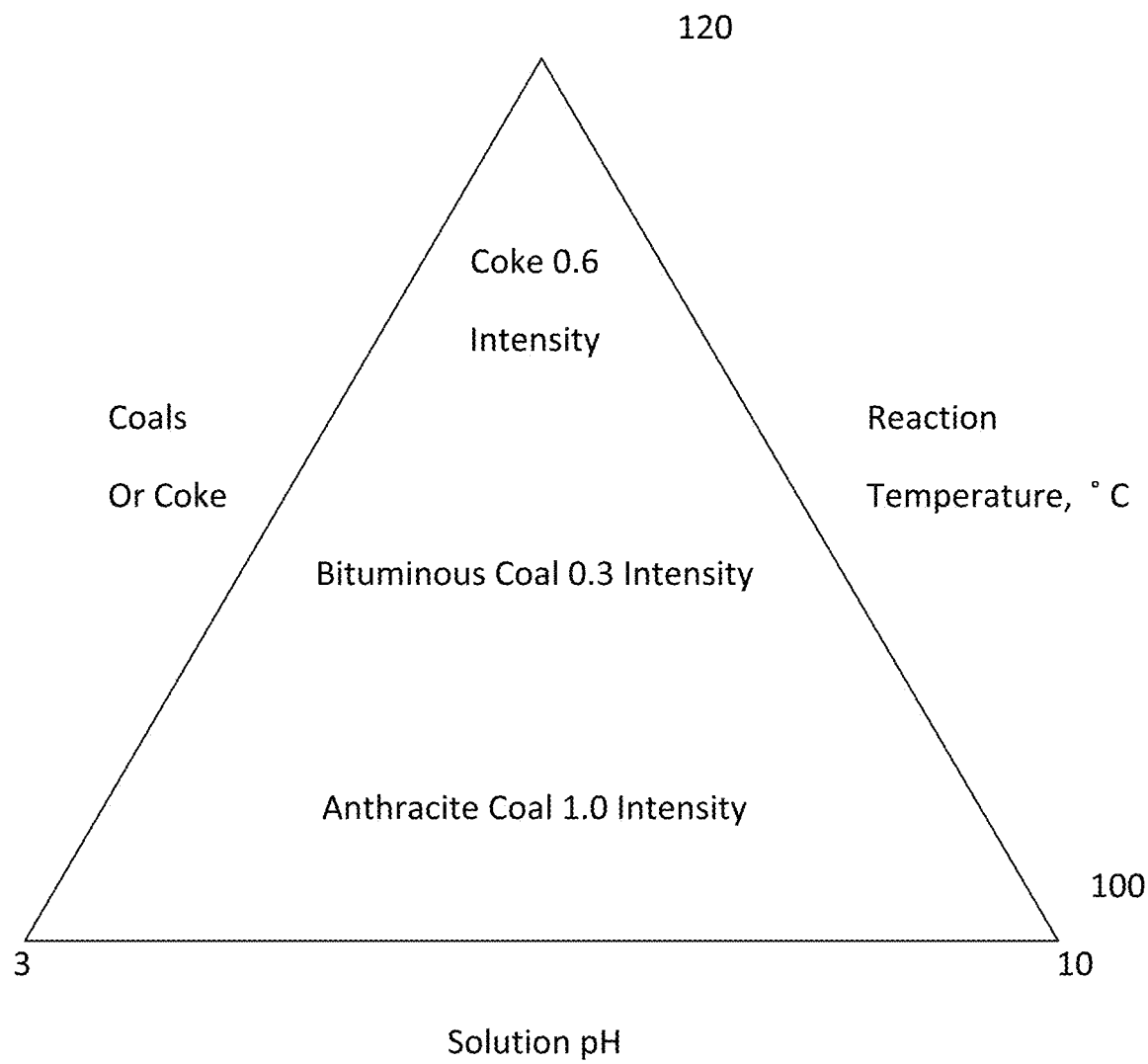
FIG. 7 is a relational, schematic depiction of the factors that combine to affect the photoluminescence pattern of wavelength and intensity of emission of graphene quantum dots (GQDs)

FIG. 7 presents the factors that, when taken together, combine to affect the photoluminescence pattern of wavelength and the intensity of emission of GQDs. The preparation of this figure was inspired by the fire triangle that shows the three elements, namely fuel, heat, and oxygen, that must be present in sufficient quantity for a fire to occur. In the present invention, yield GQDs with the desired spectral characteristic can be exploited to capture solar energy. The three elements are source material, reaction temperature, and solution pH. A multi-junction solar cell 20 can be produced by attaching GQDs in series that are tuned to different wavelength ranges (colors) to take multiple disparate harvesting operations from the solar spectrum to yield an improved aggregate efficiency, which has been calculated to be approximately sixty percent (60%).

Source Material. The GQDs synthesized from bituminous coal and anthracite coal and Coke pursue different structures. The GQDs produced from three source materials are soluble and fluorescent in aqueous solution.

Reaction Temperature. The production solution, held for 24 hours, produces GQDs with photoluminescence properties in different ranges based on the selection of the reaction temperature in the 100 or 120° C. for operating range.

Solution pH. Photoluminescence emission is pH-dependent in the range of pH 3 to pH 10. The GQDs sourced from Bituminous coal exhibit a maximum intensity at pH 6 and pH 7. When the pH changed from pH 6 to pH 3, a red wavelength shift occurs from 500 to 540 nm. When the pH increased from 7 to 10, a blue wavelength shift occurs to 460 nm.

The maximum intensity emissions for the GQD sourced from anthracite coal is 530 nm, orange-yellow. The maximum intensity emissions for the GQD sourced from bituminous coal is 460 nm, blue fluorescence. When manufacturing conditions are selected to change the size of the GQD sourced from bituminous coal changed from 2.96 nm to 2.30 nm, the emission wavelength blue shifted from 500 to 460 nm the maximum intensity emissions for the GQD sourced from Coke is 480 nm, green.

Synthesis of GQDs from Coals or Coke. In one practice of the manufacturing procedure, one can measure a given mass of coal or coke source material, such as 300 mg. The source material is suspended in a blend of concentrated sulfuric acid (60 ml) and nitric acid (20 ml). The blended material is mixed, such as by placement in a sonic mixer and held, such as for two (2) hours. The blended material is then stirred and heated in a constant temperature oil bath at a selected temperature in the range of 100 to 120° C. and held for twenty-four (24) hours. The solution is then cooled to room temperature before adding a sufficient volume of three molar (3 M) Sodium Hydroxide (NaOH) to adjust the mixture to 7 pH. The neutralized mixture is then filtered through a 0.45-μm membrane filter and subsequently purified in a 1,000 Da bag and held for five (5) days. After purification, the solution is concentrated, using rotary evaporation, to obtain solid GQDs. The GQDs prepared from coals and coke can then serve as multiple junctions in solar cells according to the invention that can be placed in illumination series to capture increased solar energy.

The conventional wisdom is that solar cells made from a single material, silicon, absorb and convert into electrical energy all photons that have greater energy than the material's threshold energy. The present inventor proposes that this is not wholly accurate, that the only photons converted into electrical energy are ones that are in a narrow range above and below the material's threshold energy.

Figure 8:
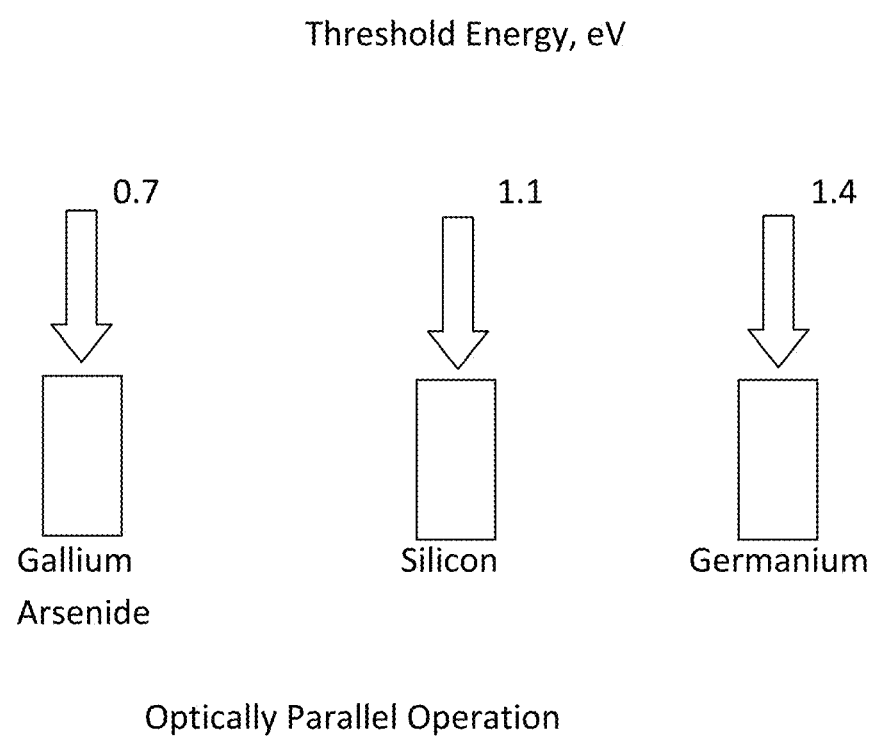
FIG. 8 is a schematic view of plural layers of photovoltaic material disposed for optically parallel operation.

On Earth, solar cells made from a single material have been found to achieve an efficiency of approximately 20% for conversion of solar energy into electrical energy. In space, solar cells made from three materials have been found to have an efficiency of approximately 40% for conversion of solar energy to electrical energy. In space, it is known to place three materials in optical series by layering the materials in by epitaxial growth, which is a costly process used in the manufacture of semiconductor devices. The present invention teaches a 90-degree rotation of the three materials with respect to incident light and seeks to achieve the same efficiency as in space, approximately 40%. Photovoltaic materials, such as gallium arsenide, silicon, and germanium, are disposed in optical parallel operation as shown in FIG. 8. This can be realized by stacking wafers 12 of material used to manufacture semiconductor devices thereby resulting in off-the-shelf availability and lowered costs.

The optically parallel operation depicted in FIG. 8, which represents a 90-degree rotation compared to the known prior art, allows direct absorption by aligning the light and material axes, which permits reduced thickness and reduced material costs. Further, under the present configuration, electrodes can be placed on the sides of the solar cell 20, which provides increased surface area for incident solar energy. Still further, as shown and described herein, the disclosed construction allows the formation of a three-sided reflective cavity to reflect or "ping pong" photons, which increases the opportunities for photons to be absorbed and turned into electrical energy. Where solar cells 20 or components of solar cells 20 are fabricated from grapheme quantum dots (GQDs), six materials may be exploited and efficiencies of approximately 60% are predicted.

In a quest to identify the elemental materials to produce high-efficiency solar cells 20, focus can be had to the area of the periodic table containing the elements that produced organic matter. A clue as to where to focus may be had by reference to the Periodic Table. Of the 118 elements, only five (5) elements, namely Carbon (C), Hydrogen (H), Silicon (Si), Nitrogen (N) and Oxygen (O), account for 98.5% of all organic matter by weight. These elements, except for Oxygen (O), are positioned in Table I of FIG. 27 as in the periodic table with adjacent elements used as dopants. Hydrogen (H) is positioned above the Group 13 elements. Also included for each element are the values of Pauling's Electronegativity Scale value, which is a measure of the ability of the element to attract electrons to itself in a covalent bond.

The atomic number of a chemical element is the number of protons found in the nucleus of an atom. Just as Lithium (Li), the lowest atomic number metal, is the material of choice for batteries due to ease of electron movement in the conductive band, Carbon (C) is, for a similar reason, a superior material choice to Silicon for solar cells, and Boron (B) and Nitrogen (N) are superior dopant materials as compared to Aluminum (Al) and Phosphorus (P).

The solar cell 20 is doped to produce an n-type semiconductor or p-type semiconductor and then capped with dopants on the Sun illumination side of the cell 20 with n-type and p-type dopants on the opposite side. The dopant elements of choice for Silicon solar cells, Boron for p-type and Nitrogen (N) for n-type, are the same as for the elements used in a Carbon (C) Solar Cell according to the present invention. The difference in electronegativity of the base elemental materials, Silicon and Carbon, and the dopants, Boron and Nitrogen (N), is shown in Table II of FIG. 28.

The Carbon (C) solar cell 20 according to the invention provides an almost equal balance of dopant electronegativity with positive 0.51 relative to Boron (B), employed as the p-type dopant, and negative 0.49 relative to Nitrogen (N), employed as the n-type dopant. The Silicon solar cell 20 provides both negative electronegativities for the dopants relative to the Silicon (Si) base material and can only function as a solar cell because the Boron (B) dopant is less electron negative relative to Nitrogen (N). The electronegativity of Hydrogen (H), positive 2.1, is comparable to the electronegativity of Boron (B), positive 2.04, resulting in a comparable difference in electronegativity relative to Carbon (C) to create favorable conditions for electron movement.

Figure 9:
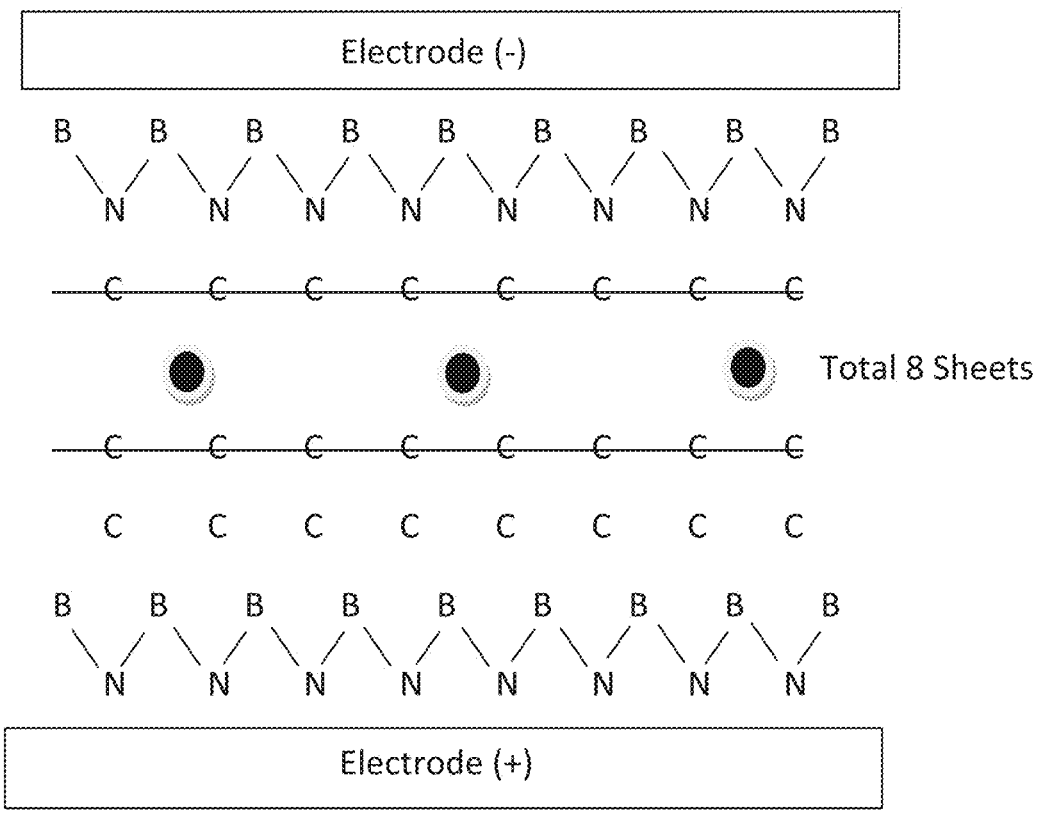
FIG. 9 is a schematic depiction of a hexagonal boron nitride sheet illustrating the effect of the magnetic field on the hexagonal boron nitride sheet.

As shown in FIG. 9, for instance, a hexagonal Boron Nitrogen (hBN) monolayer replaces the doping of Silicon to produce n-type and p-type capping regions in Solar Cells. A sheet of hBN can be made to deform when placed in a dipole magnetic field relative to Carbon (C) so that the elemental Boron (B) is in an opposite plane to the elemental Nitrogen (N). The dipole moment of an element is proportional to the relative electronegativity. The forward bias voltage is placed on the Carbon (C) solar cell in the present invention to produce a dipole magnetic field. The effect of the field on the hBN sheet is illustrated in FIG. 9.

Figure 19:
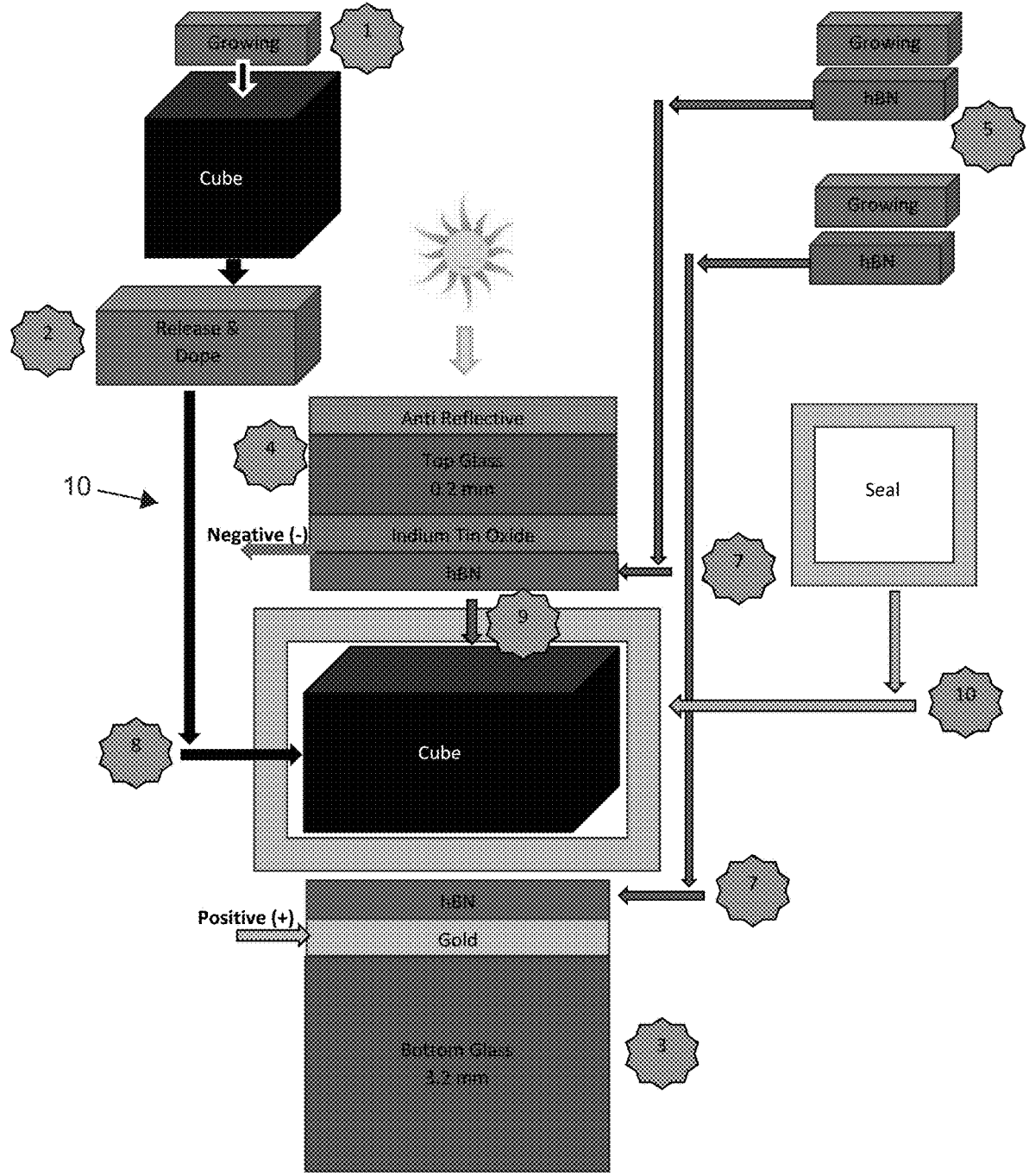
FIG. 19 is a schematic depiction of a sequence of the manufacture for solar cells.

In one example of the present invention as in FIG. 19, the negative electrode is formed of a film of Indium Tin Oxide, such as in a 185 nm thickness, with 10-15 Ohms squares deposited on a Schotts D263 Glass of 0.2 mm thickness. The glass has an anti-reflective film suitable for transmission of visible wavelengths, near IR light, and near UV light that is present in the solar spectrum. Deposited on the reverse side of the glass is the positive electrode with a film of Gold, 20 nm thick on a Borofloat 33 Glass of 3.3 mm thickness. The Gold film serves the dual function of reflecting light that passes through the carbon layers without being absorbed so that it can have additional opportunities for absorption and conversion into electrons.

Graphene is the material of choice for the solar panel. The source of Graphene can progress, for instance, from Vapor deposition in six-inch squares on Copper to thirty-inch wide film. According to the invention, a lower cost alternative for production of Graphene is the carbonization and processing of the stalk of hemp. In one practice of the invention, for example, the blast fiber is converted to Graphene by first carbonizing, such as at 180 degrees C. for 24 hours at moderate pressure, followed by treating with Potassium Hydroxide, and finally by heating and holding at 800 degrees C.

The total thickness of the Graphene layers can be scaled to the size of the Graphene Quantum Dot (GQD) that produces a spectral adsorption with the added efficiency benefit of alignment by self-assembly and direct connection to ballistic transport hBN rather than the less efficient method of Graphene Quantum Dots of transport through liquid contact.

Figure 10:
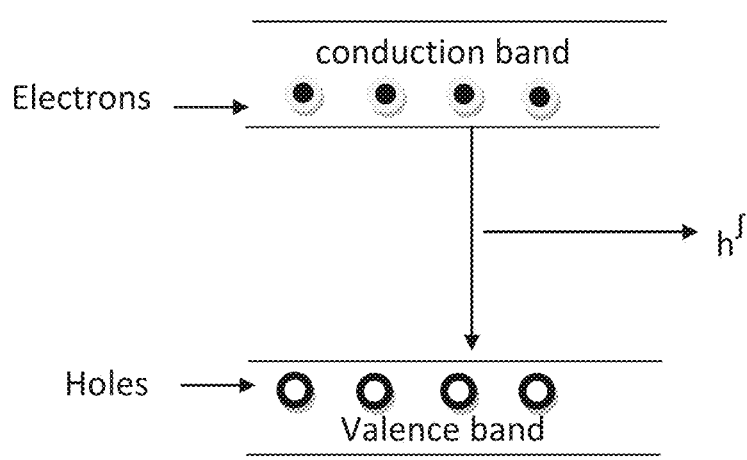
FIG. 10 schematically depicts the transmission of photons of light through the device.

Looking to FIG. 10, light emission can be perceived where photons of light at various wavelengths cause electrons to travel through the device from the Conductive Band to the hole band with lower energy. In a solar cell, the reverse occurs: photons excite electrons to move into the Conductive Band, and energy is released. The distance between the two Bands is directly proportional to the size of the gap between the Bands. That is usually a characteristic for the material measured in electron volts (eV). For instance, Silicon has a band gap of 1.1 eV.

Manifestations of the present invention can use Graphene sheets. When intersected with a perpendicular plane and rotated, Graphene sheets move from a zero eV, characteristic of a metal, to a positive eV, characteristic of a semiconductor, to an infinite eV, characteristic of an insulator. In the present invention, the Graphene is doped so that, when the same perpendicular plane is rotated, the Graphene moves from a zero eV at 30 degrees chirality, characteristic of a metal, to a positive eV, characteristic of a semiconductor at all other angles.

In a preferred embodiment of the present invention, eight (8) Graphene sheets are doped that have been grown to self-assemble in alignment from Methane ($CH_4$) and Hydrogen ($H_2$) gas in the presence of a transition metal catalyst, such as Cobalt (Co), Nickel (Ni), or another transition metal catalyst. Doping an eight (8) sheet assembly can be accomplished, for instance, by immersion in 63%, by weight, Nitric Acid ($HNO_3$) for 10 minutes.

Under the present invention, the Graphene sheet assembly (GSA) is a canvas over which the resonant primary frequency and harmonics are superimposed somewhat like antenna lengths and are based on electron path length formed by the number of sheets of Graphene. The primary frequency of the GSA is based on: 1) the assembly's total thickness, which could in one non-limiting example be 4.61 nm (10×0.335 films+9×0.14 spaces) resembling the 4 nm diameter GQD that resonates with 580 nm, Yellow (570 to 590 nm) solar spectrum light; 2) the first half harmonic, with a length of 2.3 nm, that resembles the 2 nm diameter GQD that resonates with 480 nm, Blue (450 to 495 nm) solar spectrum light; and 3) the second quarter harmonic, with a length of 1.15 nm resembles a 1 mm diameter GQD that resonates with 380 nm, Violet (380-450 nm), or more accurately near UV, solar spectrum light.

The energy available increases as resonance occurs for each photon moving from the primary frequency that corresponds to Yellow's, 2.1 eV, to the first resonant frequency that corresponds to Blue's, 2.6 eV, and finally to the second resonant frequency that corresponds to near UV, or an estimated 3.2 eV. As theorized hereunder, the presence of high electron volt photons opens the possibility for the occurrence of Multiple Excitation Generation (MEG) with individual photons achieving greater than 100% efficiency.

Figure 11:
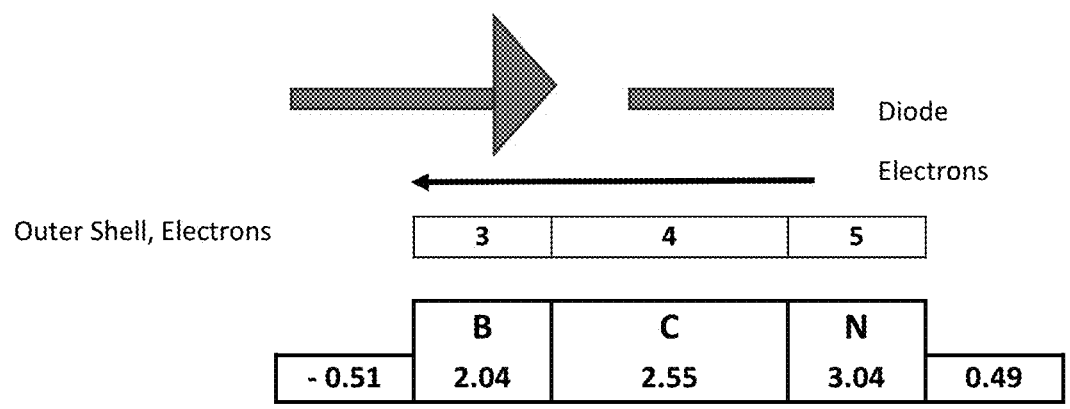
FIG. 11 is a schematic view of the device operating as a diode that passes electrons in one direction.

Light is absorbed by the Carbon, which has a higher resistance than metal for all planes of rotation that are perpendicular to the sheet. Under the invention, the Carbon is doped to increase its conductivity. One side of the Carbon is positioned adjacent to Boron, which has a valence of three electrons in its outer shell. The valance of Boron is one lower than the valance of the Carbon, which has 4 electrons in its outer shell, and the other side of the Carbon is positioned adjacent to Nitrogen with a valence having 5 electrons in its outer shell, one higher than the other valance of Carbon. As schematically depicted in FIG. 11, the device so created operates as a diode that passes the electrons generated in the solar cell in one direction only.

Figure 14:
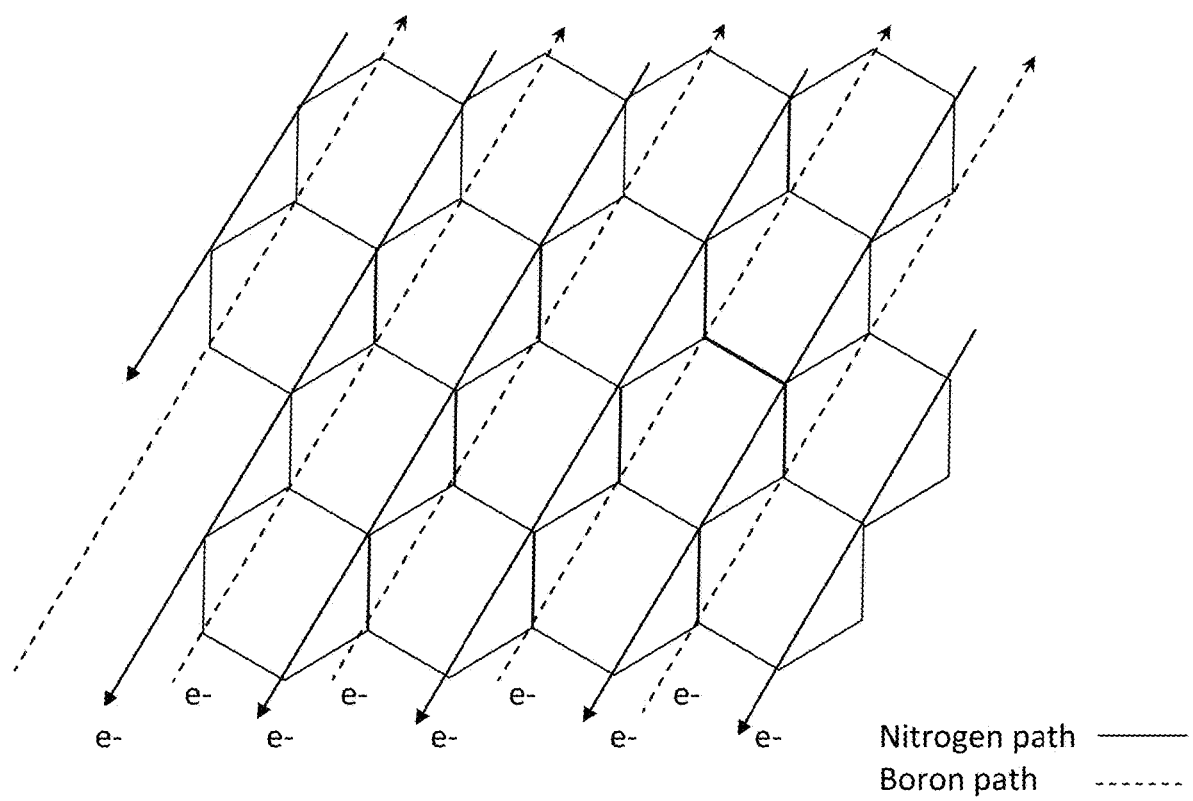
FIG. 14 is a schematic depiction of electron paths in doped carbon.

For all perpendicular planes to the Graphene sheet other than the plane that is at the Chiral, 30 degrees, the Graphene is a p-type doped semiconductor. At the Chiral plane as shown in FIG. 14, for instance, the Graphene is a blastic transporter of electrons, a superconductive path that transports electrons with almost zero energy loss. Silicon solar cells experience one third of the loss in efficiency due to re-adsorption of electrons. This occurs because of the large distance, 350,000 nm, between the electrodes in a Silicon solar cell. In the present invention, the superconductive parallel Chiral paths that run through each of the eight (8) Graphene Carbon sheets stand ready to harvest the electrons in close proximity to the points where the photon absorption occurs, and these electrons are conveyed to electrodes spaced at 3.65 nm apart: five orders of magnitude less than the distance between electrodes in a prior art Silicon Solar Cell.

In an embodiment of the present invention, the synthesis of hBN employs Nitrogen free, Boron-rich conducting electrodes arched in pure Nitrogen gas. The electrodes incorporate a very small amount of Nickel (Ni) and Cobalt (Co) as catalysts. The electrode can be formed from 99% pure Boron to which one percent, 1%, by weight of each catalytic metal is added. Both Nitrogen (N) and Boron (B) have stable isotopes that contain one neutron more in their nucleuses. The heavier isotopes have reduced electron mobility due to the greater attractive forces of the heavier nucleuses. Nitrogen-15 is present at only 0.14% of the total Nitrogen and is not a problem in the present invention. Boron-11 is present at 80.1% of the total Boron. In embodiments of the present invention, the electrode is prepared from Boron-10 to a 99% purity so that the electrons in the Boron have equivalent mobility to the electrons in Carbon and Nitrogen.

Figure 21:
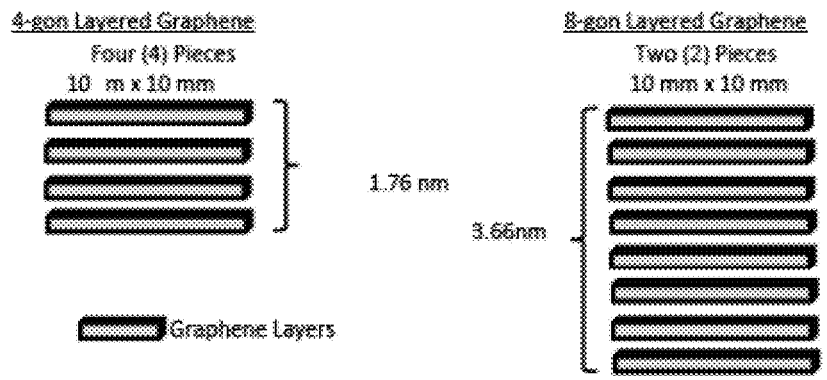
FIG. 21 shows cross-sections of wafer stacks.

In embodiments of the invention as illustrated in FIG. 21, for example, eight (8) sheets of Graphene can form what can be referred to as a Disk with a surface area. For example, the Disk can have a surface area of six (6) inches by six (6) inches and a thickness of 3.65 nm. The Disk is placed in an electrical field that results from the forward bias electrical current that flows through the Disk that folds the hBN sheets so that the Nitrogen atoms are electrically connected to the top Indium Tin Oxide electrode, and the Boron atoms are electrically connected to the bottom Gold electrode. Each sheet of Graphene attenuates the light energy. For example, when measured at 55 nm wavelength of light, light energy is attenuated by 2.6%. The light that illuminates the first sheet is reduced, based on the opacity of Graphene, to 79.2% when the light illuminates the eighth sheet. The illumination is further reduced by the absorption of photons that occurs in the sheet located in the light's path.

The Carbon-Carbon bond length is 0.14 nm in a sheet of Graphene, the same distance as the separation of the sheets of Carbon. However, the sigma bond between Carbon in the sheet of Graphene is significantly higher strength that the pi bond between layers. This allows the Disk to have a resonant response because the Disk is positioned in a cavity with freedom of vertical movement in the cavity formed by heavier bottom glass, which could for example be 3 mm thick, and the lighter top glass, which could for example be 0.2 mm thick.

Figure 12:
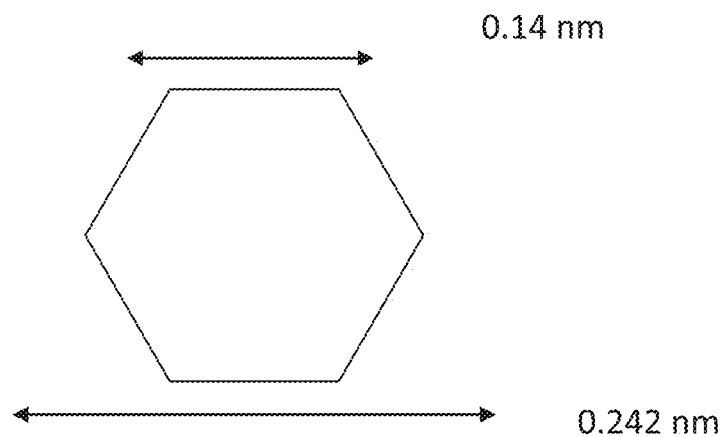
FIG. 12 is a schematic depiction of paths for absorption and conversion on a Carbon atom.

A single hexagon with Carbon atoms located at the six (6) corners can measure 0.242 nm across. Therefore, there are $40 \times 10^{16}$ Graphene hexagons in the 6"×6" surface that contain 240×10^16 Carbon atoms. The total number of Carbon atoms in the Disk that contains eight (8) sheets is 19×10^18 Carbons. These numbers show that each photon incident on the Graphene Carbon solar cell 20 has the opportunity on a path for absorption and conversion into one or more electrons by first impinging on a Carbon atom as is schematically shown in FIG. 12.

The Graphene solar cell can operate at an estimated sixty percent (60%) efficiency, with incident 1.5 AM Suns (1,000 watts per square meter) calculated to produce 15 milliamps per square centimeter at four (4) Volts or fourteen (14) Watts for a six-inch (6")×six-inch (6") cell. A solar panel 10 according to the invention of four (4) feet by six (6) feet could, for instance, contain seventy-two (72) cells and would produce a calculated 1,008 Watts or nominally one (1) Kilowatt. The same size Silicon solar panel produces 395 Watts. Embodiments of the present invention are thus estimated to produce 2.55 times the energy as the referenced prior art solar panels.

The 14-Watt cell at 4 volts produces 3.45 amps. Each amp per second is a Coulomb that contains $6.24 \times 10^{18}$ electrons or a total of $21.5 \times 10^{18}$ electrons per second. The quantity of electrons required to be produced by the cell, $21.5 \times 10^{18}$ electrons per second, approximately equals the number of Carbon atoms in the cell, $19 \times 10^{18}$ Carbons. The disclosed cell thus exceeds the one electron per photon production by Multiple Excitation Generation (MEG) producing as many as three (3) electrons per photon. Therefore, as few as one third of the Carbon atoms participate in the absorption of photons each second to produce the 14-Watt cell.

Figure 13:
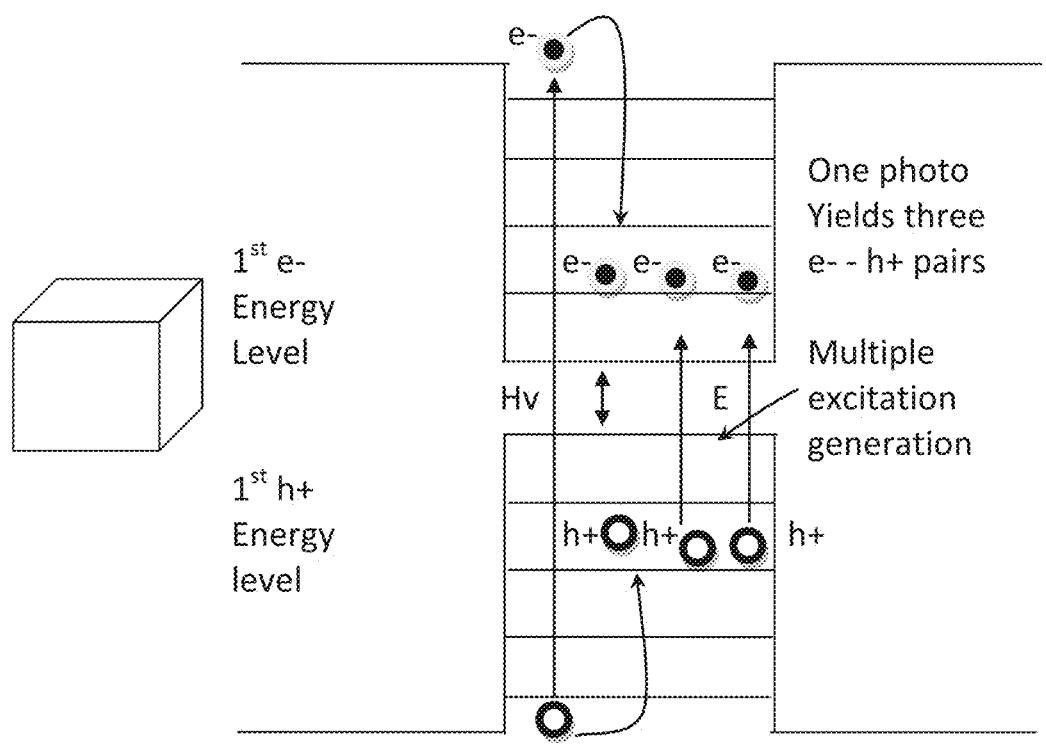
FIG. 13 is a schematic depiction of Corner Reflecting Antennas of a "Cube" as disclosed herein.

Embodiments of the Disk include what can be analogized as antennas or tuning forks that resonate to the range of frequencies of the photon of light to be absorbed and converted to electrons that are instantaneously collected and transmitted to the electrodes to produce useful power. The incident light eV is received by the Carbon's bandgap locations, and the eV of the light that exceeds the energy required to excite the electron in this band gap is split off and conducted to other of the Carbon's band gap locations to excite another electron. This process of releasing more than one electron for each photon of light that is absorbed is Multiple Excitation Generation (MEG), which increases the efficiency of the Graphene solar cell. Reference may be had to FIG. 13. These antenna-like structures in the Disk form a Multiple Carrier Generating solar cell that allows the excess energy of a photon above that required to elevate the electron at one location to be used at other locations instead of wasting this energy as heat as occurs in Silicon solar cells.

A further beneficial characteristic of the present invention is that the Graphene Carbon has the ability of aggregating the lower energy photons in the red and infrared region to produce higher energy photons. The characteristic colors of violet, blue, green, and red are emitted when low energy infrared photons are incident on Carbon atoms held in the Graphene structure. This aggregation of energy into higher energy photons is another process by which the present invention increases the conversion efficiency of the incident solar energy.

Carbon has six electrons. The energy of the pairs of electrons in the orbit shell closest to the nucleus is low, which makes these electrons not available for elevation to the conductive band. The energy level of the next pair of electrons that have a higher energy are also not available since one electron spins in the opposite direction of the other electron and acts as a counter balance. The electrons in the $2p_x$ and $2p_z$ both spin in the same direction and are available to be elevated to the conductive band. As has been previously stated, the atomic number of Carbon of six makes Carbon more reactive and more likely to release an electron to the conductive band than Silicon, which has an atomic number of 14 with a larger nucleic mass holding its electron with more force.

As an alternative to hexagonal Boron Nitrogen (hBN), Graphene can be doped to produce Nitrogen atoms with strong electron donor capability at a greater concentration by contact with nitric acid. Exposure to the nitric acid can, for instance, be for longer than 10 minutes for eight layers or more with concentrated acid and Boron atoms, with strong electron withdrawing capability, such as by thermal annealing in the presence of Boron Oxide without a need for incorporating a catalyst.

In another preferred aspect of the invention, three hBN layers are incorporated that are located at the top, the bottom, and in the center. Thus, two Graphene Cubes with four layers each are separated by an hBN layer. The electrical connection of the hBN is such that the top Graphene layer in the n-type and the bottom layer in the p-typed doped and the hBN layers are connected. Accordingly, the two portions of the cell are in electrical series.

Because both Graphene and Boron Nitride have identical hexagonal structures, hBN or the individually doped Boron Carbon (BC) and Nitrogen Carbon (NC) have the same electron paths. This allows for electron export with a minimum distance from the point of absorption to export of the electron as is depicted in FIG. 14. This reduces the chances of energy loss by re-absorption of the electrons.

Figure 15:
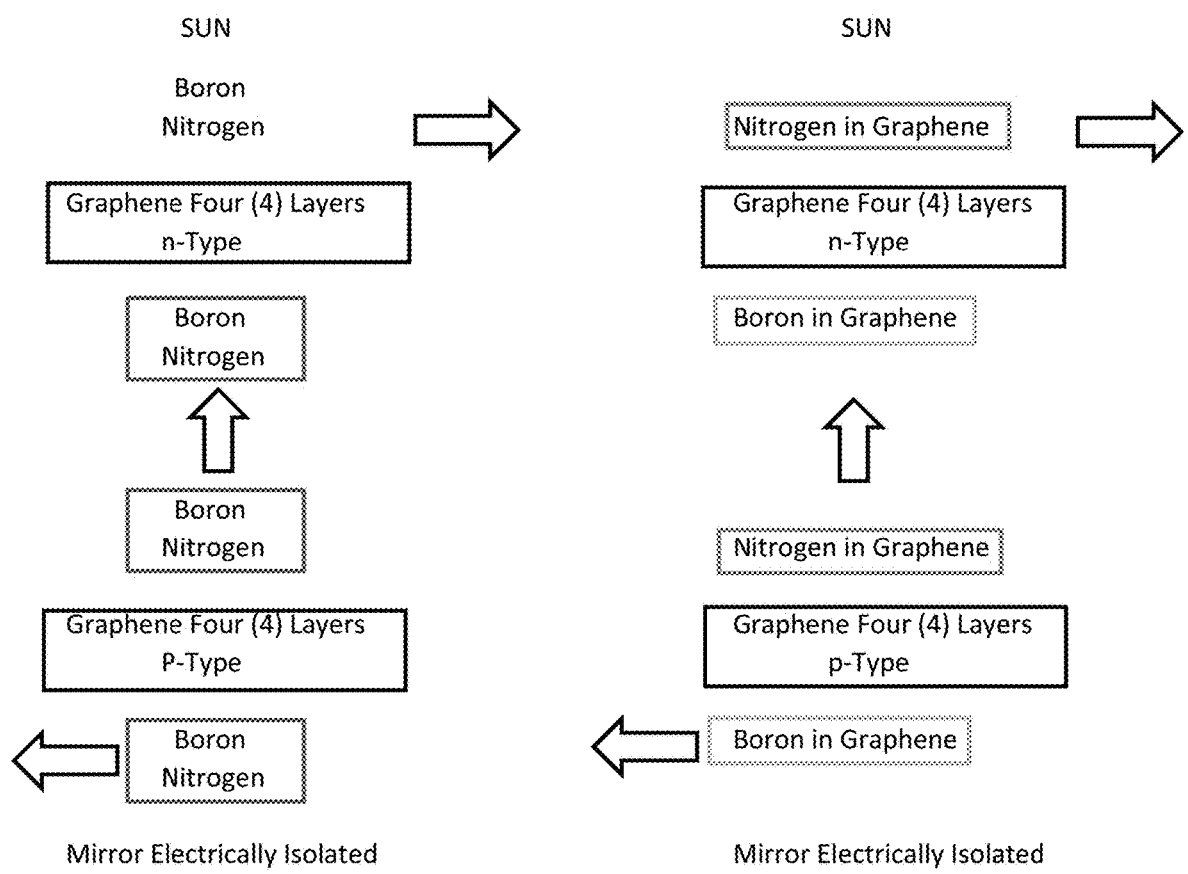
FIG. 15 provides schematic depictions of embodiments of the solar cell.

Turning to FIG. 15, two embodiments of the present invention are schematically shown. Each embodiment is electrically connected in series. However, each embodiment is different in that one utilizes hBN layers and the other utilizes BC and NC layers.

The superconductive paths in hBN are at 60 degrees chirality. This allows the use of hBN at both the top and bottom of the Graphene Disk with Nitrogen connected at the top to collect electrons without the interference of the Boron atoms and the reverse connection of the Boron atoms for electrons deficit without the interference of the Nitrogen atoms.

The Disk has multiple layers of Graphene. One or more Disks in the optical path defined by the Sun's illumination can be disposed at one end of the path and a reflective mirror can be disposed at the other end of the path. The number of layers of Graphene can be a multiple of two in each Disk, such as 2, 4, 6, or 8 layers, and the number of Disks connected in electrical and optical series can be a multiple of one, including 1, 2, 3, or 4. When more than one Disk is placed in series, the doping of the Graphene can be alternated starting with Nitrogen doping.

Figure 16:
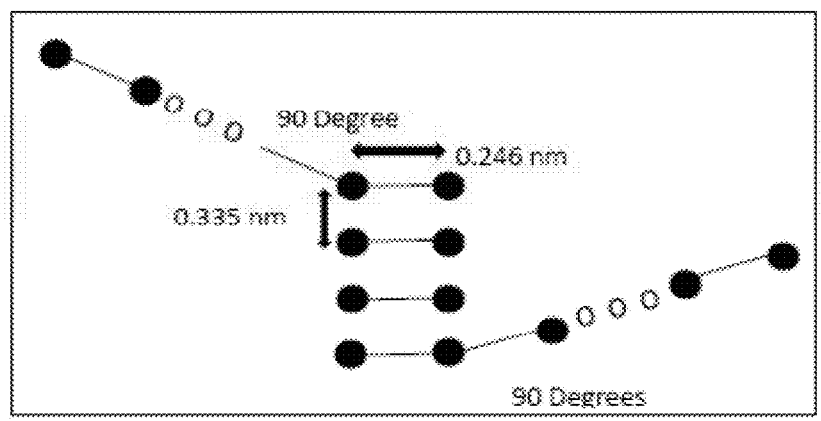
FIG. 16 is a schematic depiction of a Corner Reflecting Antenna as disclosed herein.

The Disk forms a plurality of Corner Reflecting Antennas with what can be analogized as rungs of a ladder where the rungs of the ladder are the Carbon-Carbon bonds of 0.246 nm. The spacing between layers of 0.335 nm allows harmonics of Solar Energy Frequencies to resonate with these antennas as illustrated in FIG. 16, for example.

For the Disk to achieve the design value power, 14 Watts or $2.18 \times 10^{19}$ electrons per second of production is required. The Disk, containing $4.4 \times 10^{-18}$ Carbon atoms, receives illumination of 0.6 Photons/second that make available a possible 1.8 electrons/second. Following the details and calculations of FIG. 17, the Disk can produce the requisite 14 Watts with one electron produced at a rate of 3/minute or at an efficiency of 2.7% ($100 \times (2.18 \times 10^{19}$ electrons/second)/(20 seconds$\times 1.8$ electrons/second$\times 4.4 \times 10^{18}$ Carbons).

A sequence of manufacture for solar cells as disclosed herein is depicted schematically in FIG. 19.

Figure 18:
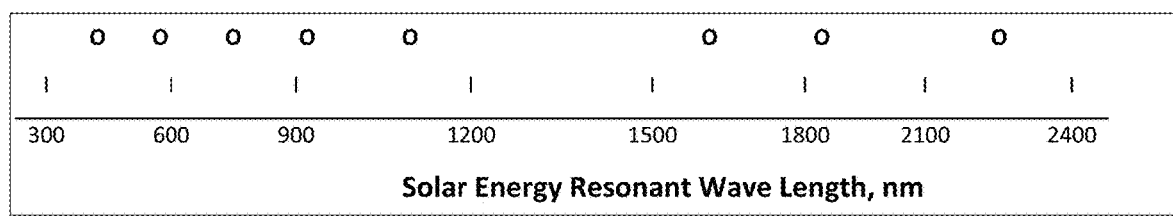
FIG. 18 provides a chart of solar energy resonant wavelengths along a spectrum and band gap for various wavelengths.

The chart of FIG. 18 depicts mean resonant receiving frequencies paired to the photon's energy of the solar spectrum. More particularly, in FIG. 18, spectral irradiation (in $W/m^2/nm$) is charted based on wavelength (in nm). Solar energy resonant wavelengths are also charted along a spectrum, and band gap (in electron Volts (eV)) is specified for various wavelengths (in nm).

Figure 22:
FIG. 22 is a schematic view of nitrogen-doped graphene.
Figure 23:
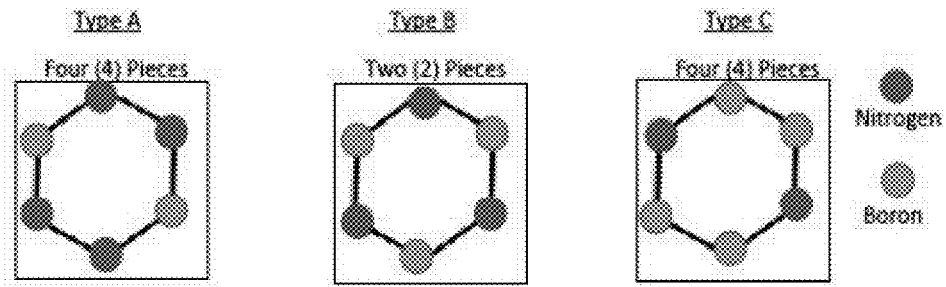
FIG. 23 is a schematic view of forms of hexagonal boron nitride.

Practices of the invention can rely on plural wafer stacks 14 with Graphene. For instance, Graphene wafer stacks 14 can be constructed for use and testing hereunder with four (4) layers of Graphene oxide nanosheets (4-GON) and two (2) stacks of eight (8) layers of Graphene oxide nanosheets (8-GON) as is shown in FIG. 21. Layers can be grown on Copper, such as by Chemical Vapor Deposition in the presence of Pentachloropyridine as described by Wang, P. B. et al, "Nitrogen-Doped Graphene via Pentachloropyridine as Sole Solid Source", Appl. Phys. Lett. 111, 033106 (2017) on a 10 mm by 10 mm area to a thickness of 0.335 nm with a spacing of 0.14 nm between layers. The layers may be grown with all layers in alignment. Doping can be n-type doping with Nitrogen-atom-doped content to 16.7%. One of the six positions is occupied by a Nitrogen atom as is depicted in FIG. 22, which provides a theoretical image of one layer of Nitrogen Doped Graphene to form an n-type semiconductor. Each hexagon can contain one Nitrogen.

Testing is intended to confirm the desired number of layers in wave stacks and the preferred doping content of Nitrogen. The number of layers is confirmed by optical measurement at 550 nm wavelength and reported to confirm the number of layers of Graphene in the wave stacks. As set forth hereinabove, each layer is calculated to attenuate the Yellow-Green light by 2.6%. Therefore, the 4-GON layered Graphene will attenuate light by 10.4%, and the 8-GON layered Graphene will attenuate light by 20.8%. Scanning electron microscopy (SEM), transmission electron microscopy (TEM), or Raman spectroscopy can be be used to confirm the doping level to 16.7% with one Nitrogen replacing one of the six (6) Carbons in the hexagonal crystalline structure.

Figure 25:
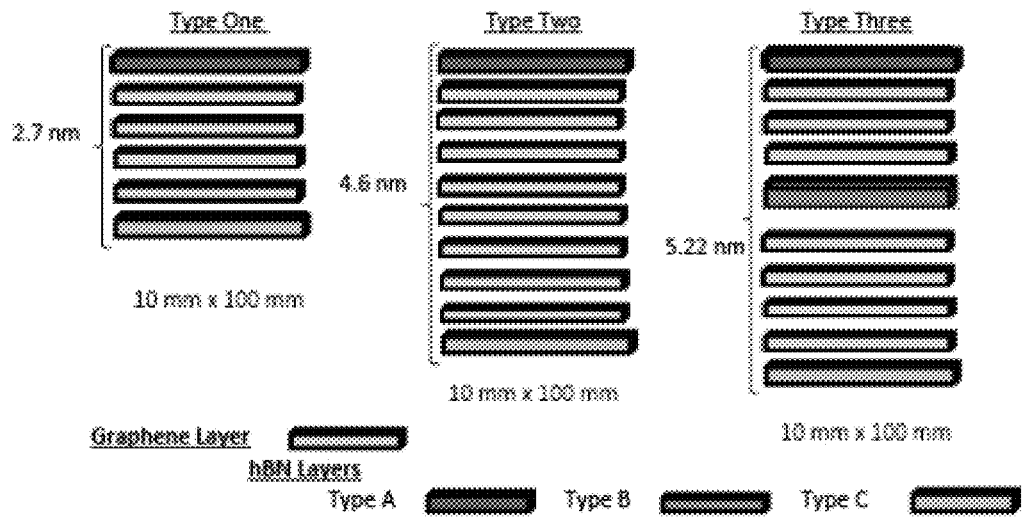
FIG. 25 comprises views in side elevation of wafer stacks as disclosed herein.

Further, practices of the invention can rely on hexagonal Boron Nitride (hBN). By way of example, testing can be performed with plural, such as ten (10), pieces of monolayer of three (3) forms, namely Types A, B and C, of hBN as depicted in FIG. 25. These can be produced, for example, by chemical vapor deposition and subsequent thermal transfer to the Graphene wafer stacks. The Boron used in the process can be Boron-10 with, for example, a 10 atomic weight to be refined from Boron that is only a percentage, such as 20%, by weight Boron-10.

Testing can further be employed to confirm the desired number of layers in the Nitrogen and Boron content. For instance, SEM, TEM, or Raman spectroscopy may be used to confirm the composition of the hBN in terms of the number of Nitrogens replacing Borons or the number of Borons replacing Nitrogens in the hexagonal crystalline structure.

Figure 24:
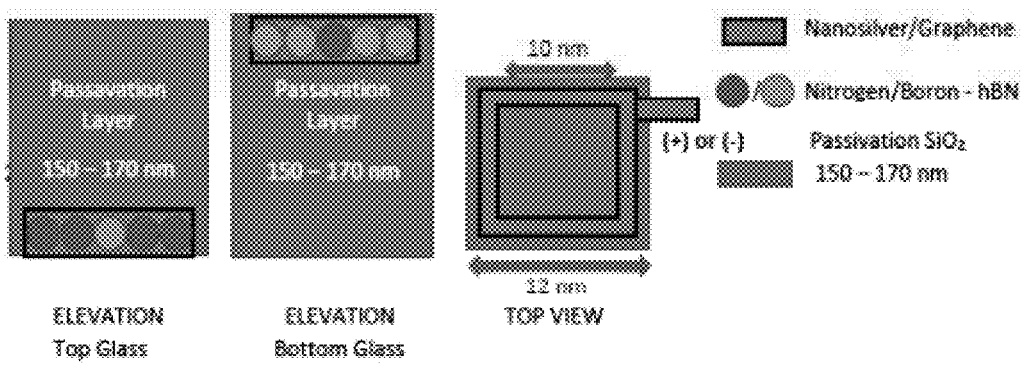
FIG. 24 are elevation views of a passivation layer according to the invention.

With respect to forming an electrode in the passivation layer for an electrical connection, the passivation layer can be etched to form a channel to contact the edge of the hBN to allow electrical connection of the hBN capped wafer stack as is depicted schematically in FIG. 24. The details included in the depiction of FIG. 24 and each other drawing figure are incorporated into the present text by reference and shall be considered to form a part of this textual disclosure.

Potential configurations for assembly of the wafer stack and the hBN can be further perceived by reference to FIG. 25. There, wafer stacks are shown as being assembled with the hBN into one each of the depicted three (3) types of stacks. The three type stacks are to be annealed.

Still further, testing can be conducted to confirm desired spacing of the stacks 14. By way of example, SEM, TEM, or Raman spectroscopy can be used to confirm the consistency of spacing of the stacks 14. The spacing can, for example, be equal to a distance of 0.14 nm between hBN and Carbon layers and 0.14 nm between Carbon Layers.

Figure 26:
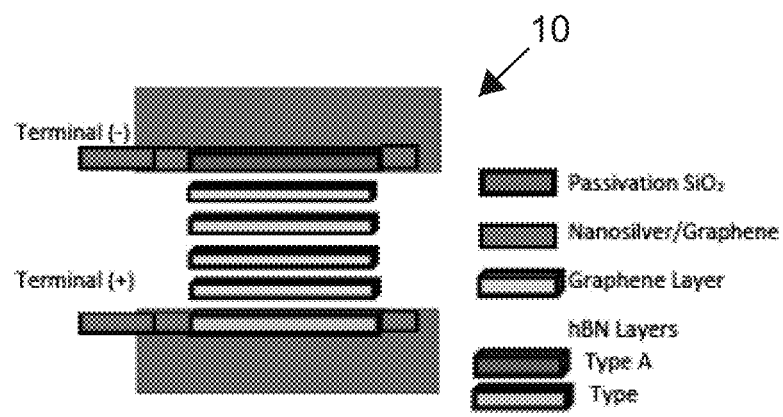
FIG. 26 is a view in side elevation of a wafer stack according to the invention.

Final assembly of a Type One wafer stack 14 with 4-GON Layers, and hBN Caps can be typical of plural types of wafer stacks 14. With additional reference to FIG. 26, a final assembly can be constructed, by way of example and not limitation, with a Type One wafer stack with 4-GON layers as follows:

a) The bottom glass is inserted into a 5 mm long Square Glass Tube (SGT), positioned at one end of the SGT, and fixed in place with epoxy;

b) The Type B hBN is thermally transferred to the bottom glass, positioned in the chemically-etched passivation layer to electrically connect through the Nanosilver/Graphene to form an anode connection for what can be referred to as a Trilogy Solar Cell; and c) The top glass is positioned above the SGT that contains the bottom glass with the Wafer Stack attached with the distance between the two glass plates at 2.7 nm measured, maintained, and fixed in place, such as with epoxy.

With certain details and embodiments of the present invention for Systems and Methods for the Conversion of Solar Energy to Electric Power disclosed, it will be appreciated by one skilled in the art that numerous changes and additions could be made thereto without deviating from the spirit or scope of the invention. This is particularly true when one bears in mind that the presently preferred embodiments merely exemplify the broader invention revealed herein. Accordingly, it will be clear that those with major features of the invention in mind could craft embodiments that incorporate those major features while not incorporating all of the features included in the preferred embodiments.

Therefore, the claims that will ultimately be employed to protect this invention will define the scope of protection to be afforded to the inventor. Those claims shall be deemed to include equivalent constructions insofar as they do not depart from the spirit and scope of the invention. It must be further noted that a plurality of the following claims may express certain elements as means for performing a specific function, at times without the recital of structure or material. As the law demands, any such claim elements shall be construed to cover not only the corresponding structure and material expressly described in this specification but also all equivalents thereof.

What is claimed as deserving the protection of Letters Patent is:

1. A system for the conversion of solar energy to electric power wherein solar light is incident on the system from an incident solar direction, the system comprising:

a solar panel installation, the solar panel installation comprising a solar panel;

wherein the solar panel comprises at least one solar cell;

wherein the solar cell is formed with a layered stack of plural layers of photovoltaic wafer material and a glass layer;

wherein each layer of photovoltaic wafer material has a first face surface, a second face surface opposite the first face surface, a recipient edge, a back edge opposite the recipient edge, and an edge direction from the recipient edge to the back edge;

wherein the solar cell is retained within the solar panel installation with the photovoltaic wafer material disposed with the edge direction of the photovoltaic wafer material in an orientation aligned with the incident solar direction;

wherein the glass layer has plural sublayers and wherein at least one of the sublayers comprises a Graphene sheet and wherein there are plural sheets of Graphene layered to form a Graphene Cube.

2. The system of claim 1 further comprising reflective material applied to at least one of the first face surface and the second face surface of one or more of the layers of photovoltaic wafer material of the solar cell thereby to facilitate an internal reflection of photons of solar light incident on the solar panel.

3. The system of claim 2 wherein the reflective material comprises a reflective metal chosen from the group consisting of gold and an alloy of gold.

4. The system of claim 3 further comprising an anti-glare layer applied to at least one surface of the solar cell.

5. The system of claim 1 wherein the photovoltaic wafer material comprises Si and Ge cells.

6. The system of claim 1 further comprising ohmic electrical contacts in electrical communication with the layered stack of plural layers of photovoltaic wafer material.

7. The system of claim 6 wherein the recipient edge of each layer of photovoltaic wafer material is devoid of the ohmic electrical contacts.

8. The system of claim 1 wherein the Graphene sheet includes doped Graphene.

9. The system of claim 8 wherein the doped Graphene of the Graphene sheet exhibits a zero eV at 30 degrees chirality to a positive eV at angles above 30 degrees.

10. The system of claim 8 wherein the doped Graphene is formed by a process of immersion in Nitric Acid ($HNO_3$) for a predetermined time.

11. The system of claim 1 wherein the glass layer further comprises hexagonal Boron Nitrogen (hBN) synthesized with Boron-rich conducting electrodes arched in pure Nitrogen gas.

12. The system of claim 1 wherein the Graphene Cube has resonating antennas operative to resonate to a range of frequencies of photons of light incident on the solar cell to be converted to electrons exhibiting Multiple Excitation Generation (MEG).

13. The system of claim 1 wherein there are plural Graphene Cubes wherein each Graphene Cube has plural sheets of Graphene layered to form the Graphene Cube and wherein the sheets of Graphene are separated by one or more hBN layers.

14. The system of claim 13 wherein each Graphene Cube has a top Graphene layer that is an n-type and a bottom layer that is a p-type doped and wherein the one or more hBN layers are electrically connected.

15. The system of claim 13 wherein there are superconductive paths in the one or more hBN layers at 60 degrees chirality.

16. The system of claim 1 wherein there are plural sheets of Graphene layered to form Graphene wafer stacks with four (4) layers of Graphene oxide nanosheets (4-GON).

17. The system of claim 1 wherein there are plural sheets of Graphene layered to form Graphene wafer stacks with eight (8) layers of Graphene oxide nanosheets (8-GON).

\* \* \* \* \*